(12) United States Patent
Lee

(10) Patent No.: US 12,364,133 B2
(45) Date of Patent: Jul. 15, 2025

(54) ELECTRONIC DEVICE INCLUDING COLOR FILTERS

(71) Applicant: SAMSUNG DISPLAY CO., LTD., Yongin-si (KR)

(72) Inventor: Hyeonbum Lee, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 554 days.

(21) Appl. No.: 17/651,133

(22) Filed: Feb. 15, 2022

(65) Prior Publication Data

US 2023/0011669 A1    Jan. 12, 2023

(30) Foreign Application Priority Data

Jul. 7, 2021    (KR) .......................... 10-2021-0089299

(51) Int. Cl.
| | |
|---|---|
| *H01L 27/32* | (2006.01) |
| *H10K 50/86* | (2023.01) |
| *H10K 59/121* | (2023.01) |
| *H10K 59/122* | (2023.01) |
| *H10K 59/38* | (2023.01) |
| *H10K 59/80* | (2023.01) |

(52) U.S. Cl.
CPC ........... *H10K 59/38* (2023.02); *H10K 50/865* (2023.02); *H10K 59/121* (2023.02); *H10K 59/122* (2023.02); *H10K 59/8792* (2023.02)

(58) Field of Classification Search
None
See application file for complete search history.

(56) References Cited

U.S. PATENT DOCUMENTS

| | | | |
|---|---|---|---|
| 10,483,331 B2 | 11/2019 | Kim | |
| 2022/0406877 A1* | 12/2022 | Cha | H10K 59/1213 |
| 2023/0217716 A1* | 7/2023 | Shen | H10K 50/865 |
| | | | 257/40 |

FOREIGN PATENT DOCUMENTS

| | | |
|---|---|---|
| KR | 1020160056483 | 5/2016 |
| KR | 1020200025980 | 3/2020 |
| KR | 1020200141421 | 12/2020 |

* cited by examiner

*Primary Examiner* — Long Pham
(74) *Attorney, Agent, or Firm* — F. CHAU & ASSOCIATES, LLC

(57) ABSTRACT

An electronic device includes a display panel including a first region, a second region, a third region, and a reflection prevention optical layer. A first light emission element is disposed in the first region, a second light emission element is disposed in the second region, and a third light emission element is disposed in the third region. The reflection prevention optical layer includes a first color filter overlapping the first light emission element, a second color filter overlapping the second light emission element, and a third color filter overlapping the third light emission element. The first color filter, the second color filter, and the third color filter transmit light of the same color, and the shape of the first color filter is different from the shape of the second color filter and the shape of the third color filter.

20 Claims, 21 Drawing Sheets

ELECTRONIC DEVICE INCLUDING COLOR FILTERS

CROSS-REFERENCE TO RELATED APPLICATIONS

This U.S. non-provisional patent application claims priority under 35 U.S.C. § 119 to Korean Patent Application No. 10-2021-0089299, filed on Jul. 7, 2021, the entire contents of which are hereby incorporated by reference.

TECHNICAL FIELD

The present disclosure herein relates to an electronic device and, more specifically, to an electronic device having color filters.

DISCUSSION OF THE RELATED ART

An electronic device may be a device composed of various electronic components such as a display panel and an electronic module. The electronic module may include a camera, an infrared sensor, a proximity sensor, or the like. The electronic module may be disposed below (e.g., behind) the display panel. The transmittance of light through some regions of the display panel may be higher than the transmittance of light through other regions of the display panel. The electronic module may receive an external input through some regions of the display panel or may provide an output through some regions of the display panel.

SUMMARY

An electronic device includes a display panel on which a first region, a second region adjacent to the first region, and a third region surrounding at least a portion of the second region are defined. A reflection prevention layer is disposed on the display panel. The display panel includes a first pixel including a first light emission element disposed in the first region and a first pixel circuit connected to the first light emission element and disposed in the second region, a second pixel including a second light emission element disposed in the second region and a second pixel circuit electrically connected to the second light emission element and disposed in the second region, and a third pixel including a third light emission element disposed in the third region and a third pixel circuit electrically connected to the third light emission element and disposed in the third region. The reflection prevention layer is an optical layer and it includes a 1-1 (first) color filter overlapping the first light emission element, a 2-1 (second) color filter overlapping the second light emission element, and a 3-1 (third) color filter overlapping the third light emission element. The 1-1 color filter, the 2-1 color filter, and the 3-1 color filter transmit light of the same color. A shape of the 1-1 color filter is different from a shape of the 2-1 color filter and a shape of the 3-1 color filter.

The display panel may further include a pixel definition pattern disposed in the first region, and on which an opening for disposing the first light emission element is defined, and a pixel definition film disposed in the second region and the third region, and on which a first opening and a second opening for respectively disposing the second light emission element and the third light emission element are defined.

The shape of the 1-1 color filter may correspond to the shape of the first light emission element.

An edge of the 1-1 color filter and the opening may each have a curve.

The shape of the 2-1 color filter may be different from the shape of the second light emission element and the shape of the 3-1 color filter may be different from the shape of the third light emission element.

The 1-1 color filter may have a circular shape and each of the 2-1 color filter and the 3-1 color filter may have a polygonal shape.

The first opening and the second opening may each have a curve.

The reflection prevention layer may further include a black matrix overlapping the pixel definition film. The black matrix may have a first partition opening overlapping the first opening and a second partition opening overlapping the second opening and the 2-1 color filter may be disposed in the first partition opening and the 3-1 color filter may be disposed in the second partition opening.

An area of the first partition opening may be greater than an area of the first opening and an area of the second partition opening may be greater than an area of the second opening.

An area of a first pixel electrode of the first light emission element is greater than an area of a third pixel electrode of the third light emission element.

The display panel may further include a connection line electrically connecting the first light emission element and the first pixel circuit to each other. The connection line may include a light transmissive material.

The first region may include a transmissive region and an element region, the first light emission element may overlap the element region, and at least a portion of the connection line may overlap the transmissive region.

The shape of the 2-1 color filter and the shape of the 3-1 color filter may be substantially the same.

The first pixel, the second pixel, and the third pixel may each be provided in plural, and the 1-1 color filter, the 2-1 color filter, and the 3-1 color filter may each be provided in plural. The plurality of 1-1 color filters may be spaced apart from each other and might not overlap each other. The plurality of 2-1 color filters may be spaced apart from each other and might not overlap each other. The plurality of 3-1 color filters may be spaced apart from each other and might not overlap each other.

The reflection prevention layer may further include a 3-2 (fourth) color filter and a 3-3 (fifth) color filter that overlap the third region. The 3-1 color filter, the 3-2 color filter, and the 3-3 color filter may transmit different colors from each other.

The 3-1 color filter may be in contact with the 3-2 color filter and the 3-3 color filter.

The 3-1 color filters may be provided in plural. The plurality of 3-1 color filters may be spaced apart from each other by the 3-2 color filter and the 3-3 color filter.

The reflection prevention layer may have a color control region which is defined thereon and overlaps the third region and does not overlap a light emission region of the third light emission element.

The area of the 3-2 color filter may equal the area of the 3-3 color filter.

The color control region might not overlap any of the 3-1 color filter, the 3-2 color filter, and the 3-3 color filter.

The 3-1 color filter, the 3-2 color filter, and/or the 3-3 color filter may overlap the color control region.

The 3-1 color filter, the 3-2 color filter, and the 3-3 color filter may each be provided in plural. The plurality of 3-1 color filters may be spaced apart from each other. The plurality of 3-2 color filters may be spaced apart from each other. The plurality of 3-3 color filters may be spaced apart from each other.

An electronic device includes a display panel on which a first region, a second region adjacent to the first region, and a third region surrounding at least a portion of the second region are defined. A reflection prevention layer is disposed on the display panel. A window is disposed above the reflection prevention layer. An electronic module is disposed below the first region of the display panel. A housing is disposed below both the display panel and the electronic module. The display panel includes a first pixel including a first light emission element disposed in the first region and a first pixel circuit connected to the first light emission element and disposed in the second region, a second pixel including a second light emission element disposed in the second region and a second pixel circuit electrically connected to the second light emission element and disposed in the second region, and a third pixel including a third light emission element disposed in the third region and a third pixel circuit electrically connected to the third light emission element and disposed in the third region. The reflection prevention layer includes a 1-1 color filter overlapping the first light emission element, a 2-1 color filter overlapping the second light emission element, and a 3-1 color filter overlapping the third light emission element. The 1-1 color filter, the 2-1 color filter, and the 3-1 color filter may transmit light of the same color, and a shape of the 1-1 color filter may be different from a shape of the 2-1 color filter and a shape of the 3-1 color filter.

BRIEF DESCRIPTION OF THE FIGURES

The accompanying drawings are included to provide a further understanding of the present inventive concept, and are incorporated in and constitute a part of this specification. The drawings illustrate exemplary embodiments of the present inventive concept and, together with the description, serve to explain principles of the present inventive concept. In the drawings.

DETAILED DESCRIPTION

Figure 1:
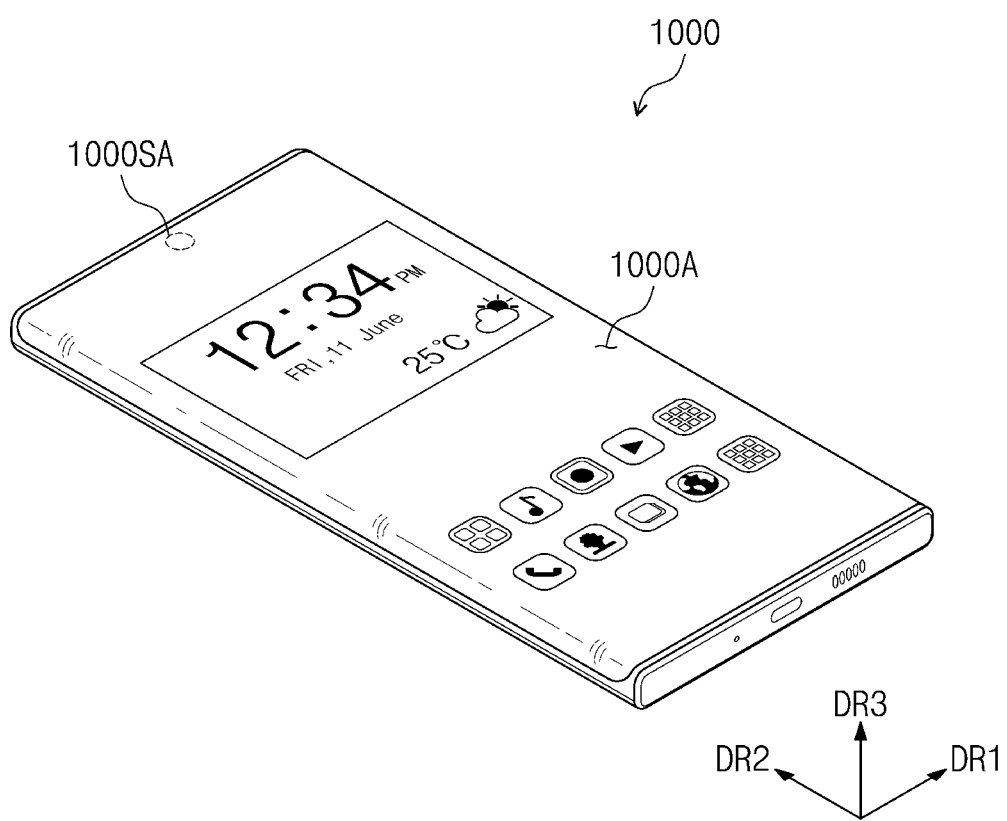
FIG. 1 is a perspective view of an electronic device according to an embodiment of the present inventive concept.

In the present disclosure, when an element (or a region, a layer, a portion, etc.) is referred to as being "on," "connected to," or "coupled to" another element, it means that the element may be directly disposed on/connected to/coupled to the other element, or that a third element may be disposed therebetween.

Like reference numerals may refer to like elements throughout the specification and the drawings. While the thickness, ratios, dimensions and angles shown in the figures to represent at least some example embodiments of the present disclosure, it is to be understood that changes may be made and the present disclosure is not necessarily limited to the thicknesses, ratios, dimensions and angles shown.

The term "and/or" includes any and all combinations of one or more of which associated elements may define.

It will be understood that, although the terms "first", "second", etc. may be used herein to describe various elements, these elements should not necessarily be limited by these terms. These terms are used to distinguish one element from another. For example, a first element may be referred to as a second element, and a second element may also be referred to as a first element in a similar manner without departing the scope of rights of the present invention. The terms of a singular form may include plural forms unless the context clearly indicates otherwise.

In addition, terms such as "below," "lower," "above," "upper," and the like are used to describe the relationship of components shown in the drawings. The terms are used as a relative concept and are described with reference to the direction indicated in the drawings.

It should be understood that the terms "comprise", "include" or "have" are intended to specify the presence of stated features, integers, steps, operations, elements, components, or combinations thereof in the disclosure, but do not preclude the presence or addition of one or more other features, integers, steps, operations, elements, components, or combinations thereof.

Hereinafter, embodiments of the present inventive concept will be described with reference to the accompanying drawings.

FIG. 1 is a perspective view of an electronic device according to an embodiment of the present inventive concept.

Referring to FIG. 1, an electronic device 1000 may be a device activated according to an electrical signal. For example, the electronic device 1000 may be a mobile phone, a tablet computer, a computer monitor, a television, a car navigation system, a game console, or a wearable device, but the embodiments of the present inventive concept are not necessarily limited thereto. In FIG. 1, the electronic device 1000 is exemplarily illustrated as a mobile phone.

The electronic device 1000 may display an image through a display region 1000A thereof. The display region 1000A may include a plane defined by a first direction DR1 and a second direction DR2 (e.g., the display region 1000A may be flat). The display region 1000A may further include curved surfaces bent from at least two sides of the plane, respectively. However, the shape of the display region 1000A is not necessarily limited thereto. For example, the display region 1000A may include only the plane, and the display region 1000A may further include four curved surfaces bent from at least two, for example, four sides of the plane, respectively.

In the display region 1000A of the electronic device 1000, a sensing region 1000SA may be defined. FIG. 1 exemplarily illustrates one sensing region 1000SA, but the number of the sensing regions 1000SA is not necessarily limited thereto. The sensing region 1000SA may be a portion of the display region 1000A. Therefore, the electronic device 1000 may display an image through the sensing region 1000SA.

In a region overlapping the sensing region 1000SA, an electronic module may be disposed. The electronic module may receive an external input transmitted through the sensing region 1000SA, or may provide an output through the sensing region 1000SA. For example, the electronic module may be a camera module, a sensor for measuring a distance, such as a proximity sensor, a sensor for recognizing a part of a user's body (e.g., a fingerprint, an iris, or a face), or a small lamp for outputting light, but the embodiments of the present inventive concept are not necessarily particularly limited thereto.

The thickness direction of the electronic device 1000 may be parallel to a third direction DR3 intersecting the first direction DR1 and the second direction DR2. Therefore, a front surface (or an upper surface) and a rear surface (or a lower surface) of elements constituting the electronic device 1000 may be defined on the basis of the third direction DR3.

Figure 2:
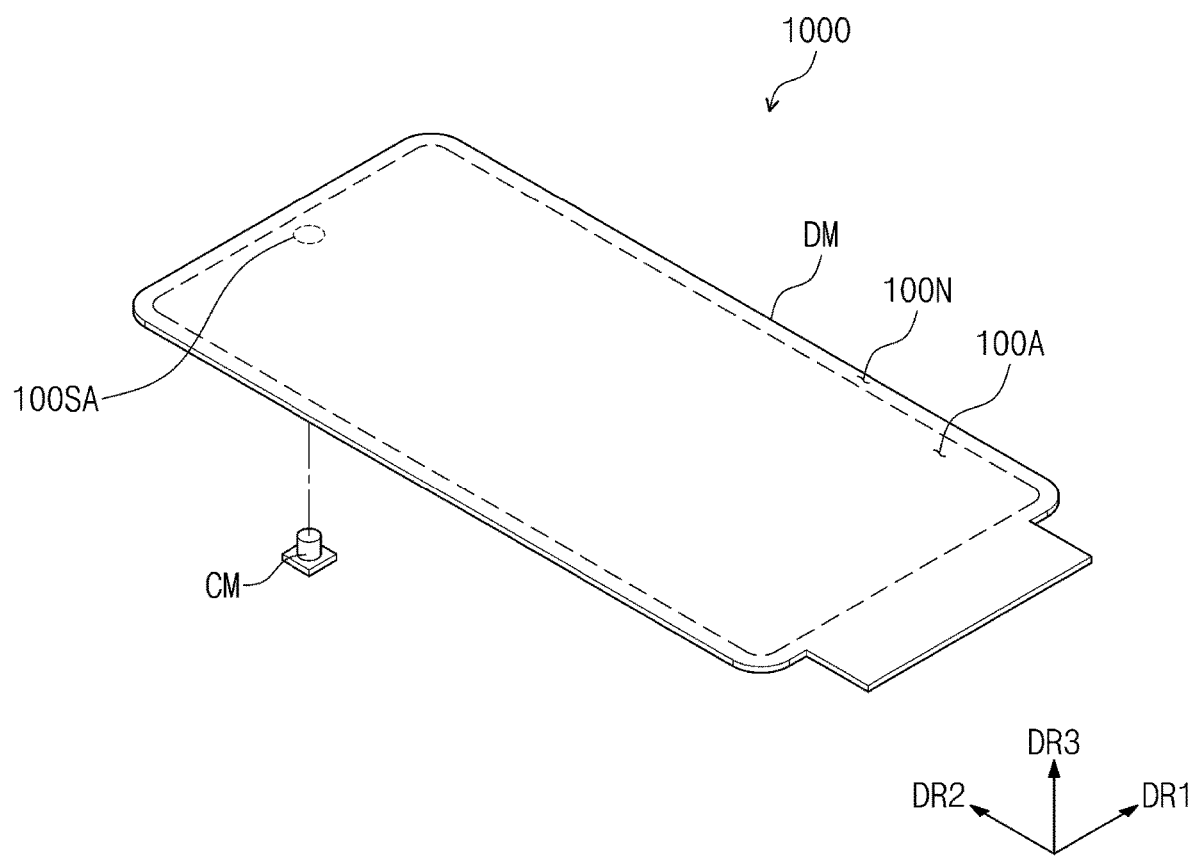
FIG. 2 is an exploded perspective view of components of an electronic device according to an embodiment of the present inventive concept.

FIG. 2 is an exploded perspective view of components of an electronic device according to an embodiment of the present inventive concept.

Referring to FIG. 2, the electronic device 1000 may include a display panel DM and an electronic module CM. The display module DM may be a component configured to generate an image and sense an input applied from the outside. The electronic module CM is disposed below the display panel DM, and may be, for example, a camera module. The display module DM may be referred to as a first electronic module, and the electronic module CM may be referred to as a second electronic module.

In the display module DM, a display region 100A and a peripheral region 100N may be defined. The display region 100A may correspond to the display region 1000A illustrated in FIG. 1. Some regions of the display module DM may have a higher transmittance than some other regions thereof, and may be defined as a sensing region 100SA. The sensing region 100SA may be a portion of the display region 100A. For example, the sensing region 100SA displays an image, and may transmit an external input provided to the electronic module CM, and/or an output from the electronic module CM.

Figure 3:
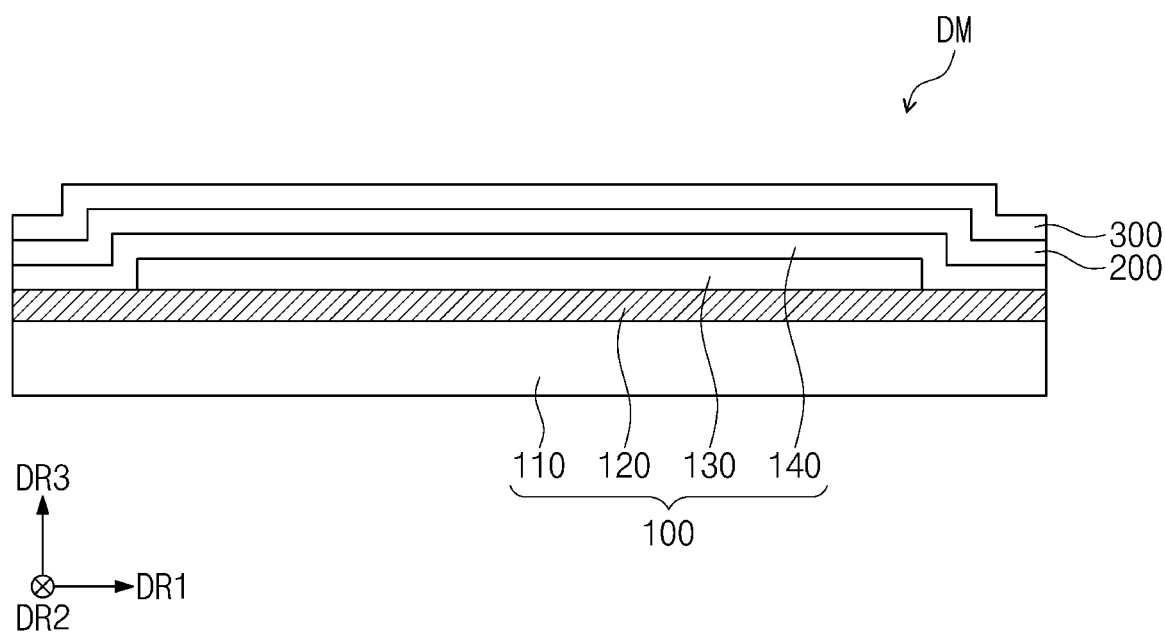
FIG. 3 is a cross-sectional view of a display module according to an embodiment of the present inventive concept.

FIG. 3 is a cross-sectional view of a display module according to an embodiment of the present inventive concept.

Referring to FIG. 3, the display module DM may include a display panel 100, a sensor layer 200, and a reflection prevention layer 300. The reflection prevention layer 300 may be an optical layer having a set of properties such as the ability to reduce reflection. This layer may be, for example, an anti-reflection layer.

The display panel 100 may be a component which substantially generates an image. The display panel 100 may be a light emission type display panel. For example, the display panel 100 may be an organic light emission display panel, an inorganic light emission display panel, a quantum-dot display panel, a micro-LED display panel, or a nano-LED display panel. The display panel 100 may be referred to as a display layer.

The display panel 100 may include a base layer 110, a circuit layer 120, a light emission element layer 130, and an encapsulation layer 140.

The base layer 110 may provide a base surface on which the circuit layer 120 is disposed. The base layer 110 may be a rigid substrate, or a flexible substrate capable of bending, folding, rolling, and the like, without cracking or otherwise sustaining damage. The base layer 110 may be a glass substrate, a metal substrate, a polymer substrate, or the like. However, the embodiment of the present inventive concept is not necessarily limited thereto, and the base layer 110 may be an inorganic layer, an organic layer, or a composite material layer.

The base layer 110 may have a multi-layered structure. For example, the base layer 110 may include a first synthetic resin layer, an intermediate layer of a multi-layered or single-layered structure, and a second synthetic resin layer disposed above the intermediate layer. The intermediate layer may be referred to as a base barrier layer. The intermediate layer may include a silicon oxide (SiOx) layer and an amorphous silicon (a-Si) layer disposed above the silicon oxide layer, but is not necessarily particularly limited thereto. For example, the intermediate layer may include a silicon oxide layer, a silicon nitride layer, a silicon oxynitride layer, and/or an amorphous silicon layer.

Each of the first and second synthetic resin layers may include a polyimide-based resin. In addition, each of the first and second synthetic resin layers may include an acrylate-based resin, a methacrylate-based resin, a polyisoprene-based resin, a vinyl-based resin, an epoxy-based resin, a urethane-based resin, a cellulose-based resin, a siloxane-based resin, a polyamide-based resin, and/or a perylene-based resin. In the present disclosure, "~~"-based resin means that a functional group of "~~" is included.

The circuit layer 120 may be disposed above the base layer 110. The circuit layer 120 may include an insulation layer, a semiconductor pattern, a conductive pattern, a signal line, and the like. The insulation layer, a semiconductor layer, and a conductive layer are formed above the base layer 110 by coating, deposition, or the like, and thereafter, the insulation layer, the semiconductor layer, and the conductive layer may be selectively patterned through performing a photolithography process a plurality of times. Thereafter, the semiconductor pattern, the conductive pattern, and the signal line, all included in the circuit layer 120, may be formed.

The light emission element layer 130 may be disposed above the circuit layer 120. The light emission element layer 130 may include a light emission element. For example, the light emission element layer 130 may include an organic light emission material, an inorganic light emission material, an organic-inorganic light emission material, a quantum dot, a quantum rod, a micro-LED, or a nano-LED.

The encapsulation layer 140 may be disposed above the light emission element layer 130. The encapsulation layer 140 may protect the light emission element layer 130 from foreign materials such as moisture, oxygen, and dust particles.

The sensor layer 200 may be disposed above the display panel 100. The sensor layer 200 may sense an external input applied from the outside. The external input may be a user input. The user input includes various forms of external inputs such as a touch from the user, light, heat, a stylus/pen, and/or pressure.

The sensor layer 200 may be formed above the display panel 100 through a continuous process. In this case, the sensor layer 200 may be expressed as being directly disposed above the display panel 100. Being directly disposed may mean that a third element is not disposed between the sensor layer 200 and the display panel 100. For example, a separate adhesive might not be disposed between the sensor layer 200 and the display panel 100. Alternatively, the sensor layer 200 and display panel 100 may be coupled to each other by an adhesive. The adhesive may include a typical adhesive or pressure-sensitive adhesive.

The reflection prevention layer 300 may be disposed above the sensor layer 200. The reflection prevention layer 300 may reduce the reflectance of external light incident from the outside of the display module DM. The reflection prevention layer 300 may be formed above the sensor layer 200 through a continuous process. The reflection prevention layer 300 may include color filters. The color filters may have a predetermined arrangement. For example, the color filters may be arranged in consideration of light emission colors of pixels included in the display panel 100. In addition, the reflection prevention layer 300 may further include a black matrix adjacent to the color filters. The reflection prevention layer 300 will be described in detail later.

In an embodiment of the present inventive concept, the sensor layer 200 may be omitted. In this case, the reflection prevention layer 300 may be disposed above the display panel 100. For example, the reflection prevention layer 300 may be directly formed above the display panel 100 through a continuous process.

In an embodiment of the present inventive concept, the positions of the sensor layer 200 and the reflection prevention layer 300 may be different from each other. For example, the reflection prevention layer 300 may be disposed between the display panel 100 and the sensor layer 200.

In an embodiment of the present inventive concept, the display module DM may further include an optical layer disposed above the reflection prevention layer 300. For example, the optical layer may be formed above the reflection prevention layer 300 through a continuous process. The optical layer may increase the front surface luminance of the display module DM by controlling the direction of light incident from the display panel 100. For example, the optical layer may include an organic insulation layer in which openings are defined respectively corresponding to light emission regions of the pixels included in the display panel 100, and a high refraction layer covering the organic insulation layer and filled in the openings. The high refraction layer may have a higher refractive index than the organic insulation layer.

Figure 4:
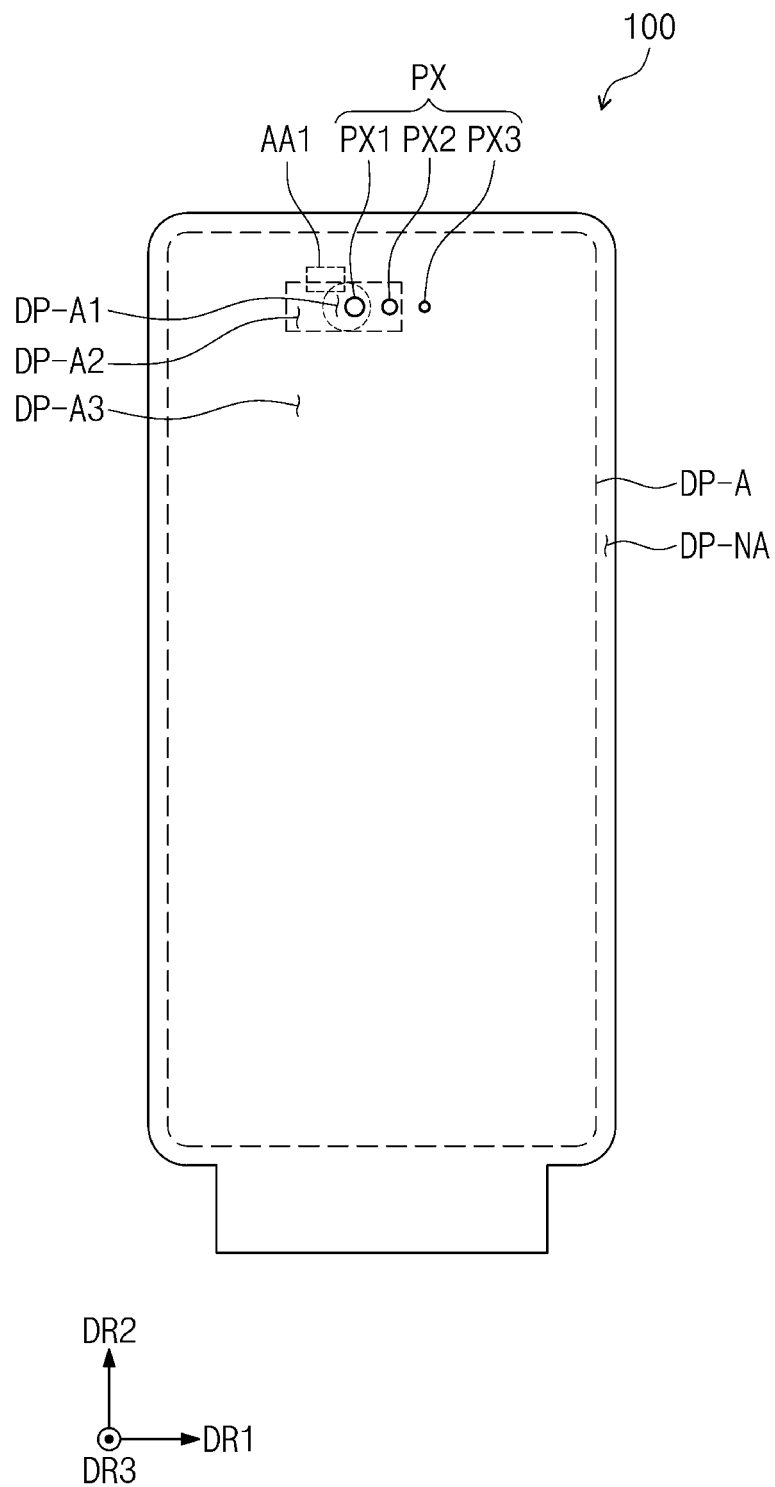
FIG. 4 is a plan view of a display panel according to an embodiment of the present inventive concept.
Figure 5:
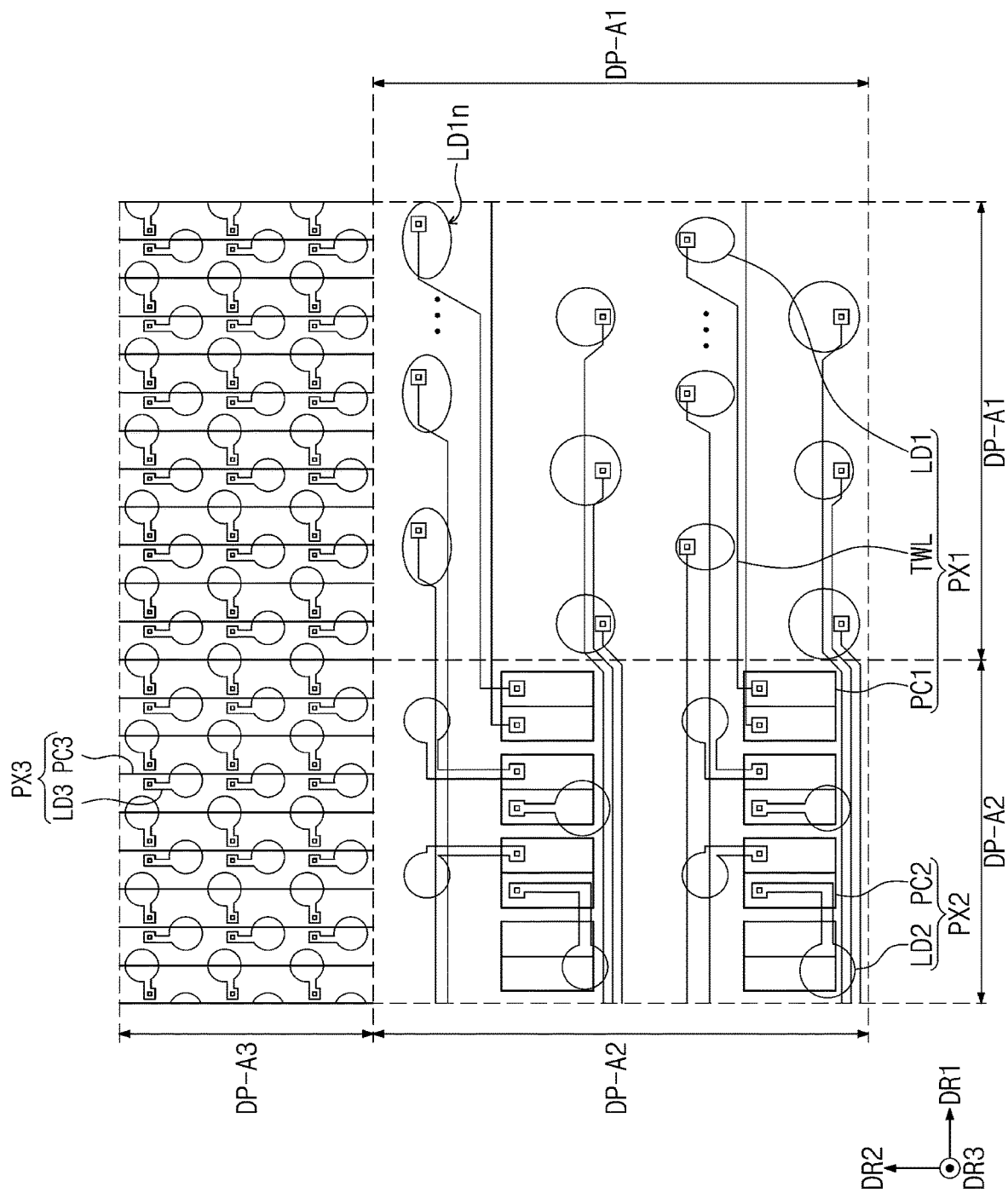
FIG. 5 is a plan view illustrating an enlarged view of region AA1 of FIG. 4.

FIG. 4 is a plan view of a display panel according to an embodiment of the present inventive concept. FIG. 5 is a plan view illustrating an enlarged view of region AA1 of FIG. 4.

Referring FIG. 4 and FIG. 5, the display panel 100 may include and a display region DP-A and a peripheral region DP-NA. The peripheral region DP-NA may be adjacent to the display region DP-A and may surround at least a portion of the display region DP-A.

The display region DP-A may include a first region DP-A1, a second region DP-A2, and a third region DP-A3. The first region DP-A1 may be referred to as a component region, the second region DP-A2 may be referred to as an intermediate region or a transition region, and the third region DP-A3 may be referred to as a main display region or a general display region. The first display area DP-A1 and the second display area DP-A2 may be referred to as an auxiliary display region.

The display panel 100 includes a plurality of pixels PX. The plurality of pixels PX may include a first pixel PX1 which emits light in the first region DP-A1, a second pixel PX2 which emits light in the second region DP-A2, and a third pixel PX3 which emits light in the third region DP-A3.

The first pixel PX1, the second pixel PX2, and the third pixel PX3 may each be provided in plural. In this case, each of the first pixel PX1, the second pixel PX2, and the third pixel PX3 may include a red pixel, a green pixel, and a blue pixel, and depending on an embodiment, may further include a white pixel.

The first pixel PX1 may include a first light emission element LD1 and a first pixel circuit PC1 which drives the first light emission element LD1, the second pixel PX2 may include a second light emission element LD2 and a second pixel circuit PC2 which drives the second light emission element LD2, and the third pixel PX3 may include a third light emission element LD3 and a third pixel circuit PC3 which drives the third light emission element LD3. The positions of the first pixel PX1, the second pixel PX2, and the third pixel PX3 illustrated in FIG. 4 are illustrated in correspondence to the positions of the first, second, and third light emission elements LD1, LD2, and LD3.

The first region DP-A1 may overlap or otherwise correspond to the sensing region 1000SA illustrated in FIG. 1. For example, the first region DP-A1 may be provided in a region overlapping the electronic module CM (see FIG. 2) on a plane. For example, an external input (e.g., light) may be provided to the electronic module CM through the first region DP-A1, and an output from the electronic module CM may be emitted to the outside through the first region DP-A1. In a present embodiment, the first region DP-A1 is illustrated in a circular shape, but may have various shapes such as a polygon, an ellipse, a figure with at least one curved side, or an irregular shape, and is not necessarily limited to any one embodiment.

To secure the area of the transmissive region, a smaller number of pixels may be provided in the first region DP-A1 than the third region DP-A3. In the first region DP-A1, a region in which the first light emission element LD1 is not disposed may be defined as a transmissive region. For example, in the first region DP-A1, a region in which a first pixel electrode of the first light emission element LD1 and a pixel definition pattern surrounding the first pixel electrode are not disposed may be defined as a transmissive region.

Within a unit area or the same area, the number of the first pixels PX1 disposed in the first region DP-A1 may be smaller than the number of the third pixels PX3 disposed in the third region DP-A3. For example, the resolution of the first region DP-A1 may be about ½, ⅜, ⅓, ¼, ⅖, ⅛, ⅑, 1/16 or the like of the resolution of the third region DP-A3. For example, the resolution of the third region DP-A3 may be about 400 ppi (pixels per inch) or higher, and the resolution of the first region DP-A1 may be about 200 ppi or 100 ppi. However, this is only an example, and the embodiment of the present disclosure is not necessarily particularly limited thereto.

The first pixel circuit PC1 of the first pixel PX1 might not be disposed in the first region DP-A1. For example, the first pixel circuit PC1 may be disposed in the second region DP-A2 or the peripheral region DP-NA. In this case, the light transmittance of the first region DP-A1 may be increased compared to a case in which the first pixel circuit PC1 is disposed in the first region DP-A1.

The first light emission element LD1 and the first pixel circuit PC1 may be electrically connected to each other through a connection line TWL. The connection line TWL may overlap the transmissive region of the first region DP-A1. The connection line TWL may include a transparent conductive line. The transparent conductive line may include a transparent conductive material or a light transmissive material. For example, the connection line TWL may be formed of a transparent conductive oxide (TCO) film, such as indium tin oxide (ITO), indium zinc oxide (IZO), indium gallium zinc oxide (IGZO), zinc oxide (ZnO) or indium oxide ($In_2O_3$).

The second region DP-A2 is adjacent to the first region DP-A1. The second region DP-A2 may surround at least a portion of the first region DP-A1. The second region DP-A2 may be a region having a lower transmittance than the first region DP-A1. In a present embodiment, the second region DP-A2 may be spaced apart from the peripheral region DP-NA. However, the embodiment of the present inventive concept is not necessarily limited thereto. The second region DP-A2 may be in contact with the peripheral region DP-NA.

In the second region DP-A2, the first pixel circuit PC1 of the first pixel PX1, the second light emission element LD2, and the second pixel circuit PC2 may be disposed. Therefore, the light transmittance of the second region DP-A2 may be lower than the light transmittance of the first region DP-A1. In addition, as the first pixel circuit PC1 of the first pixel PX1 is disposed in the second region DP-A2, within a unit area or the same area, the number of the second pixels PX2 disposed in the second region DP-A2 may be smaller than the number of the third pixels PX3 disposed in the third region DP-A3. The resolution of an image displayed in the second region DP-A2 may be lower than the resolution of an image displayed in the third region DP-A3.

The third region DP-A3 is adjacent to the second region DP-A2. The third region DP-A3 may be defined as a region having a lower transmittance than the first region DP-A1. The third region DP-A3, the third light emission element LD3 and the third pixel circuit PC3 may be disposed.

To secure a gap with the third light emission element LD3 disposed in the third region DP-A3, a first light emission element LD1n disposed in the first region DP-A1 which is disposed closest to the third region DP-A3 may have a circular shape having a larger width in a specific direction. For example, when the first region DP-A1 is adjacent to the third region DP-A3 in the second direction DR2, the width of the first light emission element LD1n in the first direction DR1 may be greater than the width thereof in the second direction DR2.

The first light emission element LD1, the second light emission element LD2, and the third light emission element LD3 may each be each provided in plural. The gap between two first light emission elements most adjacent to each other among the first light emission elements LD1 may be greater than the gap between two third light emission elements most adjacent to each other among the third light emission elements LD3. In addition, the gap between two second light emission elements most adjacent to each other among the second light emission elements LD2 may be greater than the gap between two third light emission elements most adjacent to each other among the third light emission elements LD3.

The first, second, and third light emission elements LD1, LD2, and LD3 illustrated in FIG. 5 may correspond to the shape on a plane of each of a first pixel electrode AE1 (see FIG. 7B) of the first light emission element LD1, a second pixel electrode AE2 (see FIG. 7B) of the second light emission element LD2, and a third pixel electrode AE3 (see FIG. 7A) of the third light emission element LD3. The area of the first pixel electrode AE1 (see FIG. 7B) may be greater than the area of the third pixel electrode AE3 (see FIG. 7A).

Figure 6:
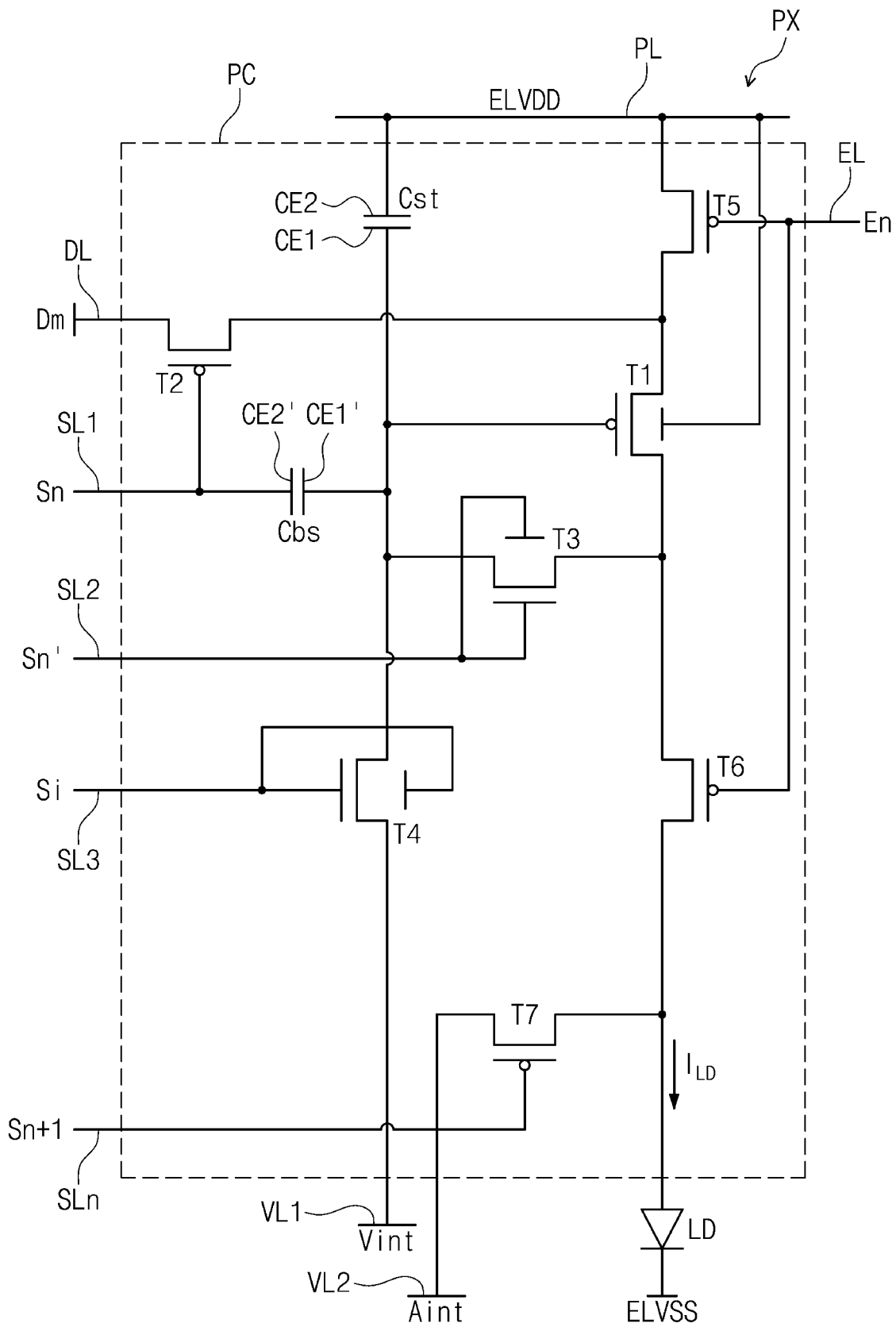
FIG. 6 is an equivalent circuit diagram of a pixel according to an embodiment of the present inventive concept.

FIG. 6 is an equivalent circuit diagram of a pixel according to an embodiment of the present inventive concept.

Referring to FIG. 6, an equivalent circuit diagram of one pixel PX among the plurality of pixels PX is illustrated. The pixel PX illustrated in FIG. 6 may be the first pixel PX1 (see FIG. 4), the second pixel PX2 (see FIG. 4), or the third pixel PX3 (see FIG. 4). The pixel PX may include a light emission element LD and a pixel circuit PC. The light emission element LD may be a component included in the light emission element layer 130 of FIG. 3, and the pixel circuit PC may be a component included in the circuit layer 120 of FIG. 3.

The pixel circuit PC may include a plurality of thin film transistors T1 to T7 and a storage capacitor Cst. The plurality of thin film transistors T1 to T7 and the storage capacitor Cst may be electrically connected to signal lines SL1, SL2, SL3, SLn, EL, and DL, a first initialization voltage line VL1, a second initialization voltage line VL2 (or an anode initialization voltage line), and a driving voltage line PL. In an embodiment, at least one of the above-described lines, e.g., the driving voltage line PL, may be shared by the pixels PX.

The plurality of thin film transistors T1 to T7 may include a driving thin film transistor T1, a switching thin film transistor T2, a compensation thin film transistor T3, a first initialization thin film transistor T4, an operation control thin film transistor T5, a light emission control thin film transistor T6, and a second initialization thin film transistor T7.

The light emission element LD may include a first electrode (e.g., an anode or a pixel electrode) and a second electrode (e.g., a cathode or a common electrode), and the first electrode of the light emission element LD may be connected to the driving thin film transistor T1 by the light emission control thin film transistor T6 and may be provided with a driving current $I_{LD}$, and the second electrode may be provided with a low power voltage ELVSS. The light emission element LD may generate light of luminance corresponding to the driving current $I_{LD}$.

Some of the plurality of thin film transistors T1 to T7 may be provided as an n-channel MOSFET (NMOS), and the others thereof may be provided as a p-channel MOSFET (PMOS). For example, among the plurality of thin film transistors T1 to T7, the compensation thin film transistor T3 and the first initialization thin film transistor T4 may be provided as an n-channel MOSFET (NMOS), and the rest may be provided as a p-channel MOSFET (PMOS).

In an embodiment, among the plurality of thin film transistors T1 to T7, the compensation thin film transistor T3, the first initialization thin film transistor T4, and the second initialization thin film transistor T7 may be provided as an n-channel MOSFET (NMOS), and the rest may be provided as a p-channel MOSFET (PMOS). Alternatively, only one of the plurality of thin film transistors T1 to T7 may be provided as an NMOS, and the rest may be provided as a PMOS. Alternatively, all of the plurality of thin film transistors T1 to T7 may be provided as an NMOS, or all thereof may be provided as a PMOS.

The signal lines may include a first scan line SL1 which transmits a first scan signal Sn, a second scan line SL2 which transmits a second scan signal Sn', a third scan line SL3 which transmits a third scan signal Si to the first initialization thin film transistor T4, a light emission control line EL which transmits a light emission control signal En to the operation control thin film transistor T5 and the light emission control thin film transistor T6, a next scan line SLn which transmits a next scan signal Sn+1 to the second initialization thin film transistor T7, and a data line DL which crosses the first scan line SL1 and transmits a data signal Dm. The first scan signal Sn may be a current scan signal, and the next scan signal Sn+1 may be a next scan signal of the first scan signal Sn.

The driving voltage line PL may transmit a driving voltage ELVDD to the driving thin film transistor T1, and the first initialization voltage line VL1 may transmit an initialization voltage Vint which initializes the driving thin film transistor T1 and a pixel electrode.

A driving gate electrode of the driving thin film transistor T1 may be connected to the storage capacitor Cst, a driving source region of the driving thin film transistor T1 may be connected to the driving voltage line PL via the operation control thin film transistor T5, a driving drain region of the driving thin film transistor T1 may be electrically connected to the first electrode of the light emission element LD via the light emission control thin film transistor T6. The driving thin film transistor T1 may receive the data signal Dm in accordance with a switching operation of the switching thin film transistor T2 and supply the driving current ILD to the light emission element ED. A switching gate electrode of the switching thin film transistor T2 may be connected to the first scan line SL1 which transmits the first scan signal Sn, a switching source region of the switching thin film transistor T2 may be connected to the data line DL, and a switching drain region of the switching thin film transistor T2 may be connected to the driving source region of the driving thin film transistor T1 and may be connected to the driving voltage line PL via the operation control thin film transistor T5. The switching thin film transistor T2 may be turned on in accordance with the first scan signal Sn received through the first scan line SL1 and perform a switching operation of transmitting the data signal Dm transmitted through the data line DL to the driving source region of the driving thin film transistor T1.

A compensation gate electrode of the compensation thin film transistor T3 is connected to the second scan line SL2. A compensation drain region of the compensation thin film transistor T3 may be connected to the driving drain region of the driving thin film transistor T1 and may be connected to a pixel electrode of the light emission element LD via the light emission control thin film transistor T6. A compensation source region of the compensation thin film transistor T3 may be connected to a first electrode CE1 of the storage capacitor Cst and to the driving gate electrode of the driving thin film transistor T1. In addition, the compensation source region may be connected to a first initialization drain region of the first initialization thin film transistor T4.

The compensation thin film transistor T3 may be turned on in accordance with the second scan signal Sn' received through the second scan line SL2 and electrically connect the driving gate electrode of the driving thin film transistor T1 and the driving drain region thereof to diode connect the driving thin film transistor T1.

A first initialization gate electrode of the first initialization thin film transistor T4 may be connected to the third scan line SL3. A first initialization source region of the first initialization thin film transistor T4 may be connected to a second initialization source region of the second initialization thin film transistor T7 and to the first initialization voltage line VL1. The first initialization drain region of the first initialization thin film transistor T4 may be connected to the first electrode CE1 of the storage capacitor Cst, the compensation source region of the compensation thin film transistor T3, and the driving gate electrode of the driving thin film transistor T1. The first initialization thin film transistor T4 may be turned on in accordance with the third scan signal Si received through the third scan line SL3 and perform an initialization operation of initializing a voltage of the driving gate electrode of the driving thin film transistor T1 by transmitting the initialization voltage Vint to the driving gate electrode of the driving thin film transistor T1.

An operation control gate electrode of the operation control thin film transistor T5 may be connected to the light emission control line EL, an operation control source region of the operation control thin film transistor T5 may be connected to the driving voltage line PL, and an operation control drain region of the operation control thin film transistor T5 may be connected to the driving source region of the driving thin film transistor T1 and to the switching drain region of the switching thin film transistor T2.

A light emission control gate electrode of the light emission control thin film transistor T6 may be connected to the light emission control line EL, a light emission control source region of the light emission control thin film transistor T6 may be connected to the driving drain region of the driving thin film transistor T1 and to the compensation drain region of the compensation thin film transistor T3, and a light emission control drain region of the light emission control thin film transistor T6 may be electrically connected to a second initialization drain region of the second initialization thin film transistor T7 and to the pixel electrode of the light emission element LD.

The operation control thin film transistor T5 and the light emission control thin film transistor T6 are simultaneously turned on in accordance with the light emission control signal En received through the light emission control line EL, so that the driving voltage ELVDD is transmitted to the light emission element LD to allow the driving current ILD to flow in the light emission element LD.

A second initialization gate electrode of the second initialization thin film transistor T7 may be connected to the next scan line SLn, the second initialization drain region of the second initialization thin film transistor T7 may be connected to the light emission control drain region of the light emission control thin film transistor T6 and to the pixel electrode of the light emission element LD, and the second initialization source region of the second initialization thin film transistor T7 may be connected to the second initialization voltage line VL2 to be provided with an anode initialization voltage Aint. The second initialization thin film transistor T7 is turned on in accordance with the next scan signal Sn+1 received through the next scan line SLn and initializes the pixel electrode of the light emission element LD.

In an embodiment, the second initialization thin film transistor T7 may be connected to the light emission control line EL and driven in accordance with the light emission control signal En. The positions of the source regions and the drain regions may be changed depending on the type (p-type or n-type) of a transistor.

The storage capacitor Cst may include the first electrode CE1 and a second electrode CE2. The first electrode CE1 of the storage capacitor Cst is connected to the driving gate electrode of the driving thin film transistor T1, and the second electrode CE2 of the storage capacitor Cst is connected to the driving voltage line PL. In the storage capacitor Cst, electric charge corresponding to the difference between the voltage of the driving gate electrode of the driving thin film transistor T1 and the driving voltage ELVDD may be stored.

A boosting capacitor Cbs may include a first electrode CE1' and a second electrode CE2'. The first electrode CE1' of the boosting capacitor Cbs may be connected to the first electrode CE1 of the storage capacitor Cst, and the second electrode CE2' of the boosting capacitor Cbs may be provided with the first scan signal Sn. The boosting capacitor Cbs may increase the voltage of a gate electrode of the driving thin film transistor T1 at the time when the supply of the first scan signal Sn is stopped, thereby compensating for a voltage drop of the gate electrode.

The specific operation of each pixel PX according to an embodiment is as follows.

During an initialization period, when the third scan signal Si is supplied through the third scan line SL3, the first initialization thin film transistor T4 is turned on in correspondence to the third scan signal Si, and the driving thin film transistor T1 is initialized by the initialization voltage Vint supplied from the first initialization voltage line VL1.

During a data programming period, when the first scan signal Sn and the second scan signal Sn' are supplied through the first scan line SL1 and the second scan line SL2, the switching thin film transistor T2 and the compensation thin film transistor T3 are turned on in correspondence to the first scan signal Sn and the second scan signal Sn'. At this time, the driving thin film transistor T1 is diode connected by the turned-on compensation thin film transistor T3, and is biased in a forward direction.

Then, a compensation voltage Dm+Vth (wherein Vth is the value of (−)) reduced by a threshold voltage Vth of the driving thin film transistor T1 from the data signal Dm supplied from the data line DL is applied to the driving gate electrode of the driving thin film transistor T1.

To both ends of the storage capacitor Cst, the driving voltage ELVDD and the compensation voltage Dm+Vth are applied, and in the storage capacitor Cst, electric charge corresponding to the voltage difference between both ends are stored.

During a light emission period, the operation control thin film transistor T5 and the light emission control thin film transistor T6 are turned on by the light emission control signal En supplied from the light emission control line EL. The driving current ILD corresponding to the voltage difference between the voltage of the driving gate electrode of the driving thin film transistor T1 and the driving voltage ELVDD is generated, and through the light emission control thin film transistor T6, the driving current ILD is supplied to the light emission element LD.

In a present embodiment, at least one of the plurality of thin film transistors T1 to T7 includes a semiconductor layer including an oxide, and the rest thereof include a semiconductor layer including silicon.

For example, the driving thin film transistor T1 which directly affects the brightness of a display device is configured to include a semiconductor layer made of polycrystalline silicon having high reliability, through which a high-resolution display device may be implemented.

Since an oxide semiconductor has high carrier mobility and low leakage current, a voltage drop is not large even when driving time is long. For example, since there is no significant change in the color of an image due to a voltage drop even during low-frequency driving, low-frequency driving is possible.

Since the oxide semiconductor has relatively low leakage current as described above, at least one of the compensation thin film transistor T3, the first initialization thin film transistor T4, and the second initialization thin film transistor T7, which are connected to the driving gate electrode of the driving thin film transistor T1, may be employed as an oxide semiconductor to prevent leakage current which may flow to the driving gate electrode and to reduce power consumption.

Figure 7A:
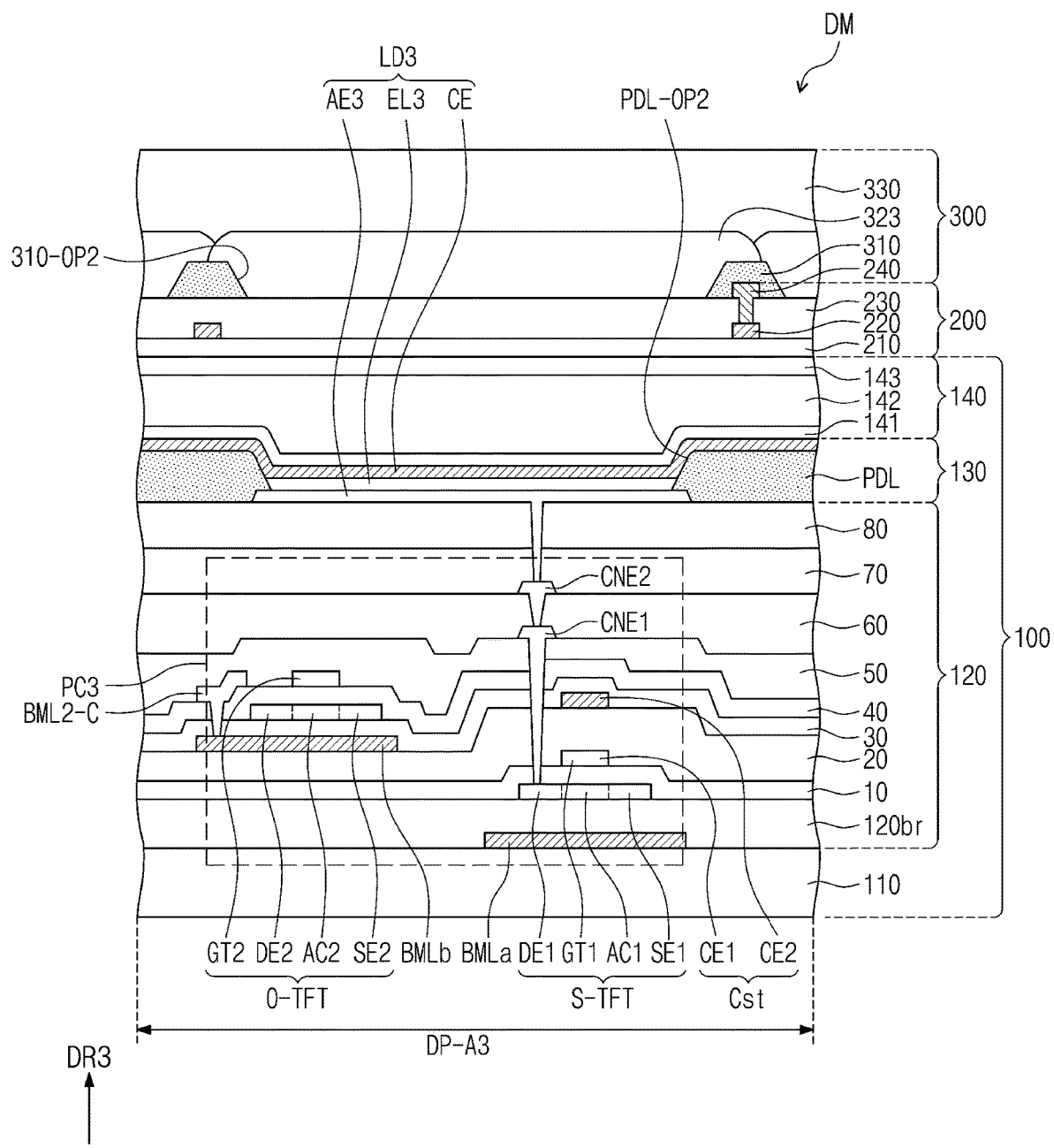
FIG. 7A is a cross-sectional view of a display module according to an embodiment of the present inventive concept.
Figure 7B:
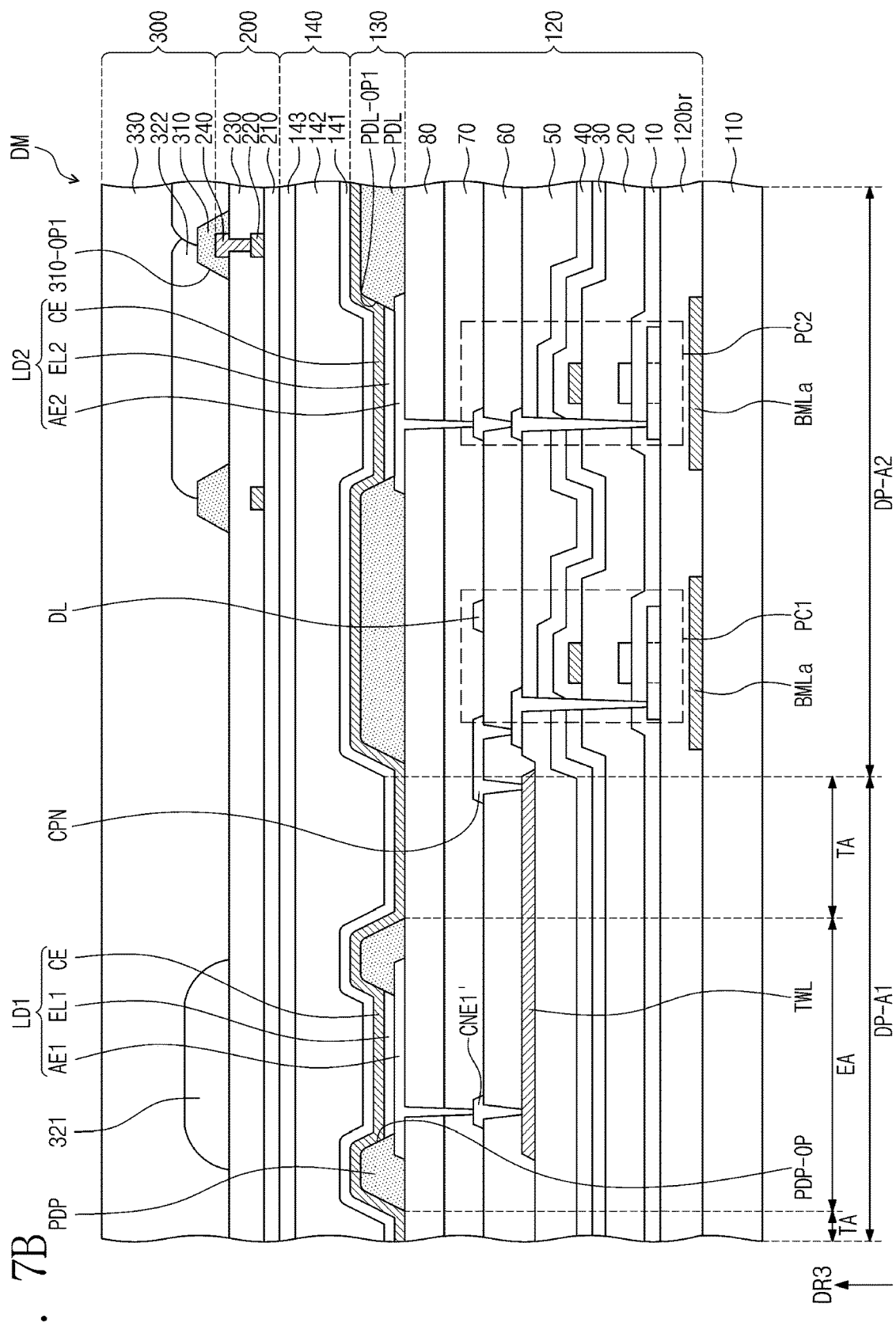
FIG. 7B is a cross-sectional view of a display module according to an embodiment of the present inventive concept.

FIG. 7A is a cross-sectional view of a display module according to an embodiment of the present inventive concept. FIG. 7B is a cross-sectional view of a display module according to an embodiment of the present inventive concept. FIG. 7A is a cross-sectional view of a portion including the third region DP-A3, and FIG. 7B is a cross-sectional view of a portion including the first region DP-A1 and the second region DP-A2.

Referring to FIG. 7A and FIG. 7B, the display panel 100 may include a plurality of insulation layers, a semiconductor pattern, a conductive pattern, a signal line, and the like. An insulation layer, a semiconductor layer, and a conductive layer are formed by coating, deposition, and the like. Thereafter, the insulation layer, the semiconductor layer, and the conductive layer may be selectively patterned by photolithography. The semiconductor pattern, the conductive pattern, the signal line, and the like included in the circuit layer 120 and the light emission element layer 130 are formed in the above manner. Thereafter, the encapsulation layer 140 which covers the light emission element layer 130 may be formed.

In FIG. 7A, a silicon thin film transistor S-TFT and an oxide thin film transistor O-TFT of the third light emission element LD3 and the third pixel circuit PC3 (see FIG. 5) are illustrated. In FIG. 7B, the first light emission element LD1, the first pixel circuit PC1, the second light emission element LD2, and the second pixel circuit PC2 are illustrated.

A buffer layer 120*br* may be disposed on the base layer 110. The buffer layer 120*br* may prevent metal atoms or impurities from diffusing into a first semiconductor pattern from the base layer 110. In addition, the buffer layer 120*br* may control the rate of providing heat during a crystallization process for forming the first semiconductor pattern, thereby allowing the first semiconductor pattern to be uniformly formed.

A first back metal layer BMLa may be disposed below the silicon thin film transistor S-TFT, and a second rear metal layer BMLb may be disposed below the oxide thin film transistor O-TFT. The first and second back metal layers BMLa and BMLb may overlap the first to third pixel circuits PC1, PC2, and PC3 to protect the first to third pixel circuits PC1, PC2, and PC3. The first and second back metal layers BMLa and BMLb may block an electric potential due to polarization of the base layer 110 from affecting the first to third pixel circuits PC1, PC2, and PC3.

The first back metal layer BMLa may be disposed corresponding to at least a portion of the pixel circuit PC (see FIG. 6). In an embodiment, the first back metal layer BMLa may overlap the driving thin film transistor T1 (see FIG. 6) provided as the silicon thin film transistor S-TFT.

The first back metal layer BMLa may be disposed between the base layer 110 and the buffer layer 120*br*. In an embodiment of the present inventive concept, the first back metal layer BMLa may be disposed on the base layer 110 in which an organic film and an inorganic film are alternately stacked, and an inorganic barrier layer may further be disposed between the first back metal layer BMLa and the buffer layer 120*br*.

The first back metal layer BMLa may be connected to an electrode or a line to receive a constant voltage or a signal therefrom. For example, the first back metal layer BMLa may receive the driving voltage ELVDD (see FIG. 6). In an embodiment, the first back metal layer BMLa may be provided in a form isolated from another electrode or another line.

The second back metal layer BMLb may correspond to a lower portion of the oxide thin film transistor O-TFT. The second back metal layer BMLb may be disposed between a second insulation layer 20 and a third insulation layer 30. The second back metal layer BMLb may be disposed on the same layer as the second electrode CE2 of the storage capacitor Cst. The second back metal layer BMLb may be connected to a contact electrode BML2-C to receive a constant voltage or a signal therefrom. The contact electrode BML2-C may be disposed on the same layer as a second gate electrode GT2 of the oxide thin film transistor O-TFT.

The first back metal layer BMLa and the second back metal layer BMLb may each include a reflective metal. For example, the first back metal layer BMLa and the second back metal layer BMLb may include silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), titanium (Ti), p+ doped amorphous silicon, and the like. The first back metal layer BMLa and the second back metal layer BMLb may include the same material or may include different metals.

The first semiconductor pattern may be disposed on the buffer layer 120*br*. The first semiconductor pattern may include a silicon semiconductor. For example, the silicon semiconductor may include amorphous silicon, polycrystalline silicon, and the like. For example, the first semiconductor pattern may include low temperature polysilicon.

FIG. 7A only illustrates a portion of the first semiconductor pattern disposed on the buffer layer 120*br*, and the first semiconductor pattern may further be disposed in another region. The first semiconductor pattern may be arranged according to a specific rule across pixels. The first semiconductor pattern may have different electrical properties depending on whether or not the first semiconductor pattern is doped. The first semiconductor pattern may include a first region having a high conductivity rate and a second region having a low conductivity rate. The first region may be doped with an N-type dopant or a P-type dopant. A P-type transistor may include a doped region which has been doped with the P-type dopant, and an N-type transistor may include a doped region which has been doped with the N-type dopant. The second region may be a non-doped region or a region doped to lower concentration than the first region.

The conductivity of the first region may be greater than the conductivity of the second region, and the first region may substantially serve as an electrode or a signal line. The second region may substantially correspond to an active region (or a channel) of a transistor. For example, a portion of a semiconductor pattern may be an active region of a transistor, another portion thereof may be a source or a drain of the transistor, and the other portion thereof may be a connection electrode or a connection signal line.

A source region SE1, an active region AC1, and a drain region DE1 of the silicon thin film transistor S-TFT may be formed from the first semiconductor pattern. The source region SE1 and the drain region DE1 may be extended in opposite directions from the active region AC1 on a cross section.

A first insulation layer 10 may be disposed on the buffer layer 120*br*. The first insulation layer 10 commonly overlaps a plurality of pixels and may cover the first semiconductor pattern. The first insulation layer 10 may be an inorganic layer and/or an organic layer and may have a single-layered structure or a multi-layered structure. The first insulation layer 10 may include aluminum oxide, titanium oxide, silicon oxide, silicon nitride, silicon oxynitride, zirconium oxide, and/or hafnium oxide. In a present embodiment, the first insulation layer 10 may be a silicon oxide layer of a single layer. Not only the first insulation layer 10 but also an insulation layer of the circuit layer 120, to be described later, may be an inorganic layer and/or an organic layer, and may have a single-layered structure or a multi-layered structure. The inorganic layer may include at least one of the above-described materials, but the embodiment of the present inventive concept is not necessarily limited thereto.

A gate GT1 of the silicon thin film transistor S-TFT is disposed on the first insulation layer 10. The gate GT1 may be a portion of a metal pattern. The gate GT1 overlaps the active region AC1. In a process of doping the first semiconductor pattern, the gate GT1 may function as a mask. The gate GT1 may include titanium (Ti), silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), indium tin oxide (ITO), indium zinc oxide (IZO), and the like, but is not necessarily particularly limited thereto.

The second insulation layer 20 is disposed on the first insulation layer 10 and may cover the gate GT1. The second insulation layer 20 may be an inorganic layer and/or an organic layer and may have a single-layered or multi-layered structure. The second insulation layer 20 may include silicon oxide, silicon nitride, and/or silicon oxynitride. In a present embodiment, the second insulation layer 20 may have a multi-layered structure including a silicon oxide layer and a silicon nitride layer.

The third insulation layer 30 may be disposed on the second insulation layer 20. The third insulation layer 30 may have a single-layered or multi-layered structure. For example, the third insulation layer 30 may have a multi-layered structure including a silicon oxide layer and a silicon nitride layer. The second electrode CE2 of the storage capacitor Cst may be disposed between the second insulation layer 20 and the third insulation layer 30. In addition, the first electrode CE1 of the storage capacitor Cst may be disposed between the first insulation layer 10 and the second insulation layer 20.

A second semiconductor pattern may be disposed on the third insulation layer 30. The second semiconductor pattern may include an oxide semiconductor. The oxide semiconductor may include a plurality of regions distinguished according to whether a metal oxide has been reduced. A region in which the metal oxide has been reduced (hereinafter, a reduction region) has greater conductivity than a region in which the metal oxide has not been reduced (hereinafter, a non-reduction region). The reduction region substantially serves as a source/drain or signal line of a transistor. The non-reduction region substantially corresponds to an active region (or a semiconductor region, a channel) of a transistor. For example, a portion of the second semiconductor pattern may be an active region of a transistor, another portion thereof may be a source/drain region of the transistor, and the other portion thereof may be a signal transmissive region.

A source region SE2, an active region AC2, and a drain region DE2 of the oxide thin film transistor O-TFT may be formed from the second semiconductor pattern. The source region SE2 and the drain region DE2 may be extended in opposite directions from the active region AC2 on a cross section.

A fourth insulation layer 40 may be disposed on the third insulation layer 30. The fourth insulation layer 40 may commonly overlap a plurality of pixels and may cover the second semiconductor pattern. The fourth insulation layer 40 may include aluminum oxide, titanium oxide, silicon oxide, silicon nitride, silicon oxynitride, zirconium oxide, and/or hafnium oxide.

A gate GT2 of the oxide thin film transistor O-TFT is disposed on the fourth insulation layer 40. The gate GT2 may be a portion of a metal pattern. The gate GT2 overlaps the active region AC2. In a process of doping the second semiconductor pattern, the gate GT2 may function as a mask.

A fifth insulation layer 50 is disposed on the fourth insulation layer 40 and may cover the gate GT2. The fifth insulation layer 50 may be an inorganic layer and/or an organic layer and may have a single-layered or multi-layered structure.

A first connection electrode CNE1 may be disposed on the fifth insulation layer 50. The first connection electrode CNE1 may be electrically connected to the drain region DE1 of the silicon thin film transistor S-TFT through a contact hole passing through the first to fifth insulation layers 10, 20, 30, 40, and 50. For example, the silicon thin film transistor S-TFT may be the driving thin film transistor T1 described with reference to FIG. 6, and the first connection electrode CNE1 may be electrically connected to the drain region DE1 of the silicon thin film transistor S-TFT via the light emission control thin film transistor T6 (see FIG. 6). Therefore, although the first connection electrode CNE1 is illustrated as being directly connected to the drain region DE1 of the silicon thin film transistor S-TFT in FIG. 7A, the first connection electrode CNE1 may be electrically connected to the drain region DE1 via the light emission control thin film transistor T6 (see FIG. 6).

A sixth insulation layer 60 may be disposed on the fifth insulation layer 50. A second connection electrode CNE2 may be disposed on the sixth insulation layer 60. The second connection electrode CNE2 may be connected to the first connection electrode CNE1 through a contact hole passing through the sixth insulation layer 60. A seventh insulation layer 70 is disposed on the sixth insulation layer 60 and may cover the second connection electrode CNE2. An eighth insulation layer 80 may be disposed on the seventh insulation layer 70.

The sixth insulation layer 60, the seventh insulation layer 70, and the eighth insulation layer 80 may each be an organic layer. For example, the sixth insulation layer 60, the seventh insulation layer 70, and the eighth insulation layer 80 may each include a general purpose polymer such as benzocyclobutene (BCB), polyimide, hexamethyldisiloxane (HMDSO), polymethylmethacrylate (PMMA), or polystyrene (PS), a polymer derivative having a phenolic group, an acrylic polymer, an imide-based polymer, an aryl ether-based polymer, an amide-based polymer, a fluorine-based polymer, a p-xylene-based polymer, a vinyl alcohol-based polymer, and a blend thereof.

The light emission element layer 130 including the first to third light emission elements LD1, LD2, and LD3 may be disposed above the circuit layer 120. The first light emission element LD1 may include a first pixel electrode AE1, a first light emission layer EL1, and a common electrode CE, the second light emission element LD2 may include a second pixel electrode AE2, a second light emission layer EL2, and the common electrode CE, and the third light emission element LD3 may include a third pixel electrode AE3, a third light emission layer EL3, and the common electrode CE. The common electrode CE may be connected to the pixels PX (see FIG. 4) and commonly provided.

The first pixel electrode AE1, the second pixel electrode AE2, and the third pixel electrode AE3 may be disposed on the eighth insulation layer 80. The first pixel electrode AE1, the second pixel electrode AE2, and the third pixel electrode AE3 may each be a (semi)transmissive electrode or a reflective electrode. In an embodiment, the first pixel electrode AE1, the second pixel electrode AE2, and the third pixel electrode AE3 may each be provided with a reflective layer formed of Ag, Mg, Al, Pt, Pd, Au, Ni, Nd, Ir, Cr, or a compound thereof, and a transparent or translucent electrode layer formed on the reflective layer. The transparent or translucent electrode layer may be provided with indium tin oxide (ITO), indium zinc oxide (IZO), indium gallium zinc oxide (IGZO), zinc oxide (ZnO) or indium oxide ($In_2O_3$), and/or aluminum-doped zinc oxide (AZO). For example, the first pixel electrode AE1, the second pixel electrode AE2, and the third pixel electrode AE3 may each be provided with ITO/Ag/ITO.

A pixel definition film PDL and a pixel definition pattern PDP may be disposed above the eighth insulation layer 80. The pixel definition film PDL and the pixel definition pattern PDP include the same material and may be formed through in the same process. The pixel definition film PDL and the pixel definition pattern PDP may each have properties of adsorbing light. For example, the pixel definition film PDL and the pixel definition pattern PDP may each have a color of black. The pixel definition film PDL and the pixel definition pattern PDP may each have a black coloring agent. The black coloring agent may include a black dye and/or a black pigment. The black coloring agent may include a metal such as carbon black or chromium, or an oxide thereof.

The pixel definition pattern PDP may be disposed in the first region DP-A1. The pixel definition pattern PDP may cover a portion of the first pixel electrode AE1. For example, the pixel definition pattern PDP may cover an edge of the first pixel electrode AE1. When viewed on a plane, the pixel definition pattern PDP may have a ring shape. The phase "when viewed on a plane" may mean when viewed from the third direction DR3.

The pixel definition film PDL may be disposed in the second region DP-A2 and the third region DP-A3. The pixel definition film PDL may cover a portion of each of the second pixel electrode AE2 and the third pixel electrode AE3. For example, in the pixel definition film PDL, a first opening PDL-OP1 which exposes a portion of the second pixel electrode AE2 and a second opening PDL-OP2 which exposes a portion of the third pixel electrode AE3 may be defined.

The pixel definition pattern PDP may increase the distance between the edge of the first pixel electrode AE1 and the common electrode CE, and the pixel definition film PDL may increase the distance between an edge of each of the second and third pixel electrodes AE2 and AE3 and the common electrode CE. Therefore, the pixel definition pattern PDP and the pixel definition film PDL may prevent arcs and the like from occurring at the edge of each of the first to third pixel electrodes AE1, AE2, and AE3.

In the first region DP-A1, a region overlapping a portion in which the first pixel electrode AE1 and the pixel definition pattern PDP are disposed may be defined as an element region EA, and the remaining region may be defined as a transmissive region TA.

The first pixel electrode AE1 may be electrically connected to the first pixel circuit PC1 disposed in the second region DP-A2. For example, the first pixel electrode AE1 may be electrically connected to the first pixel circuit PC1 through the connection line TWL and a connection bridge CPN. In this case, the connection line TWL may overlap the transmissive region TA. Therefore, the connection line TWL may include a light transmissive material.

The connection line TWL may be disposed between the fifth insulation layer 50 and the sixth insulation layer 60 but it is not necessarily particularly limited thereto. The connection bridge CPN may be disposed between the sixth insulation layer 60 and the seventh insulation layer 70. The connection bridge CPN may be connected to the connection line TWL and the first pixel circuit PC1.

The first light emission layer EL1 may be disposed above the first pixel electrode AE1, the second light emission layer EL2 may be disposed above the second pixel electrode AE2, and the third light emission layer EL3 may be disposed above the third pixel electrode AE3. In a present embodiment, the first to third light emission layers EL1, EL2, and EL3 may each emit light of at least one color among blue, red, and green.

The common electrode CE may be disposed above the first to third light emission layers EL1, EL2, and EL3. The common electrode CE may have an integral shape (e.g., may be formed of a single continuous structure) and may be commonly disposed in the plurality of pixels PX (see FIG. 4).

A hole control layer may be disposed between the first to third pixel electrodes AE1, AE2, and AE3 and the first to third light emission layers EL1, EL2, and EL3. The hole control layer includes a hole transport layer and may further include a hole injection layer. An electron control layer may be disposed between the first to third light emission layers EL1, EL2, and EL3 and the common electrode CE. The electron control layer includes an electron transport layer and may further include an electron injection layer. The hole control layer and the electron control layer may be commonly formed in the plurality of pixels PX (see FIG. 4) using an open mask.

The encapsulation layer 140 may be disposed above the light emission element layer 130. The encapsulation layer 140 may include an inorganic layer 141, an organic layer 142, and an inorganic layer 143 sequentially stacked, but layers constituting the encapsulation layer 140 are not necessarily limited thereto.

The inorganic layers 141 and 143 may protect the light emission element layer 130 from moisture and oxygen, and the organic layer 142 may protect the light emission element layer 130 from foreign materials such as dust particles. The inorganic layers 141 and 143 may include a silicon nitride layer, a silicon oxynitride layer, a silicon oxide layer, a titanium oxide layer, an aluminum oxide layer, or the like. The organic layer 142 may include an acrylic organic layer, but it is not necessarily limited thereto.

The sensor layer 200 may be disposed above the display panel 100. The sensor layer 200 may be referred to as a sensor, an input sensing layer, or an input sensing panel. The sensor layer 200 may include a base layer 210, a first conductive layer 220, a sensing insulation layer 230, a second conductive layer 240.

The base layer 210 may be directly disposed above the display panel 100. The base layer 210 may be an inorganic layer including at least one of silicon nitride, silicon oxynitride, or silicon oxide. Alternatively, the base layer 210 may be an organic layer including an epoxy resin, an acrylic resin, or an imide-based resin. The base layer 210 may have a single-layered structure, or a multi-layered structure in which layers are stacked along the third direction DR3.

Each of the first conductive layer 220 and the second conductive layer 240 may have a single-layered structure, or a multi-layered structure in which layers are stacked along the third direction DR3.

A conductive layer of a single-layered structure may include a metal layer or a transparent conductive layer. The metal layer may include molybdenum, silver, titanium, copper, aluminum, or an alloy thereof. The transparent conductive layer may include a transparent conductive oxide such as indium tin oxide (ITO), indium zinc oxide (IZO), zinc oxide (ZnO), indium tin zinc oxide (ITZO), or the like. In addition, the transparent conductive layer may include a conductive polymer such as PEDOT, a metal nanowire, graphene, and the like.

A conductive layer of a multi-layered structure may include metal layers. The metal layers may have, for example, a three-layered structure of titanium/aluminum/titanium. The conductive layer of a multi-layered structure may include at least one metal layer and at least one transparent conductive layer.

The sensing insulation layer 230 may be disposed between the first conductive layer 220 and the second conductive layer 240. The sensing insulation layer 230 may include an inorganic film. The inorganic film may include at least one of aluminum oxide, titanium oxide, silicon oxide, silicon nitride, silicon oxynitride, zirconium oxide, or hafnium oxide.

Alternatively, the sensing insulation layer 230 may include an organic film. The organic film may include an acrylic resin, a methacryl-based resin, polyisoprene, a vinyl-based resin, an epoxy-based resin, a urethane-based resin, a cellulose-based resin, a siloxane-based resin, a polyimide-based resin, a polyamide-based resin, and/or a perylene-based resin.

The reflection prevention layer 300 may be disposed above the sensor layer 200. The reflection prevention layer 300 may include a black matrix 310, a 1-1 (first) color filter 321, a 2-1 (second) color filter 322, a 3-1 (third) color filter 323, and a planarization layer 330.

A material constituting the black matrix 310 is not necessarily particularly limited as long as it is a material which absorbs light. The black matrix 310 is a layer having a black color, and in an embodiment, the black matrix 310 may include a black coloring agent. The black coloring agent may include a black dye and a black pigment. The black coloring agent may include a metal such as carbon black or chromium, or an oxide thereof.

The black matrix 310 may cover the second conductive layer 240 of the sensor layer 200. The black matrix 310 may prevent external light reflection by the second conductive layer 240. The black matrix 310 may overlap the second region DP-A2 and the third region DP-A3, and might not overlap the first region DP-A1. For example, a portion of the black matrix 310 overlapping the first region DP-A1 may be removed. Therefore, the transmittance in the first region DP-A1 may be further increased.

A plurality of partition openings 310-OP1 and 310-OP2 may be defined in the black matrix 310. The first partition opening 310-OP1 may overlap the second pixel electrode AE2, and the second partition opening 310-OP2 may overlap the third pixel electrode AE3.

The 1-1 color filter 321 may overlap the first region DP-A1, the 2-1 color filter 322 may overlap the second region DP-A2, and the 3-1 color filter 323 may overlap the third region DP-A3. The 1-1 color filter 321 may overlap the first pixel electrode AE1, the 2-1 color filter 322 may overlap the second pixel electrode AE2, and the 3-1 color filter 323 may overlap the third pixel electrode AE3.

Since the black matrix 310 does not overlap the first region DP-A1, the 1-1-1 color filter 321 may be spaced apart from the black matrix 310. For example, the 1-1 color filter 321 might not be in contact with the black matrix 310. The 2-1 color filter 322 may cover the first partition opening 310-OP1, and the 3-1 color filter 323 may cover the second partition opening 310-OP2. The 2-1 color filter 322 and the 3-1 color filter 323 may each be in contact with the black matrix 310. The opening area of the first and second partition openings 310-OP1 and 310-OP2 of the black matrix 310 may be greater than the opening area of the first and second openings PDL-OP1 and PDL-OP2 of the pixel definition film PDL.

The planarization layer 330 may cover the 1-1 color filter 321, the 2-1 color filter 322, and the 3-1 color filter 330. The planarization layer 330 may include an organic substance, and a flat surface may be provided on an upper surface of the planarization layer 330. In an embodiment, the planarization layer 330 may be omitted.

Figure 8:
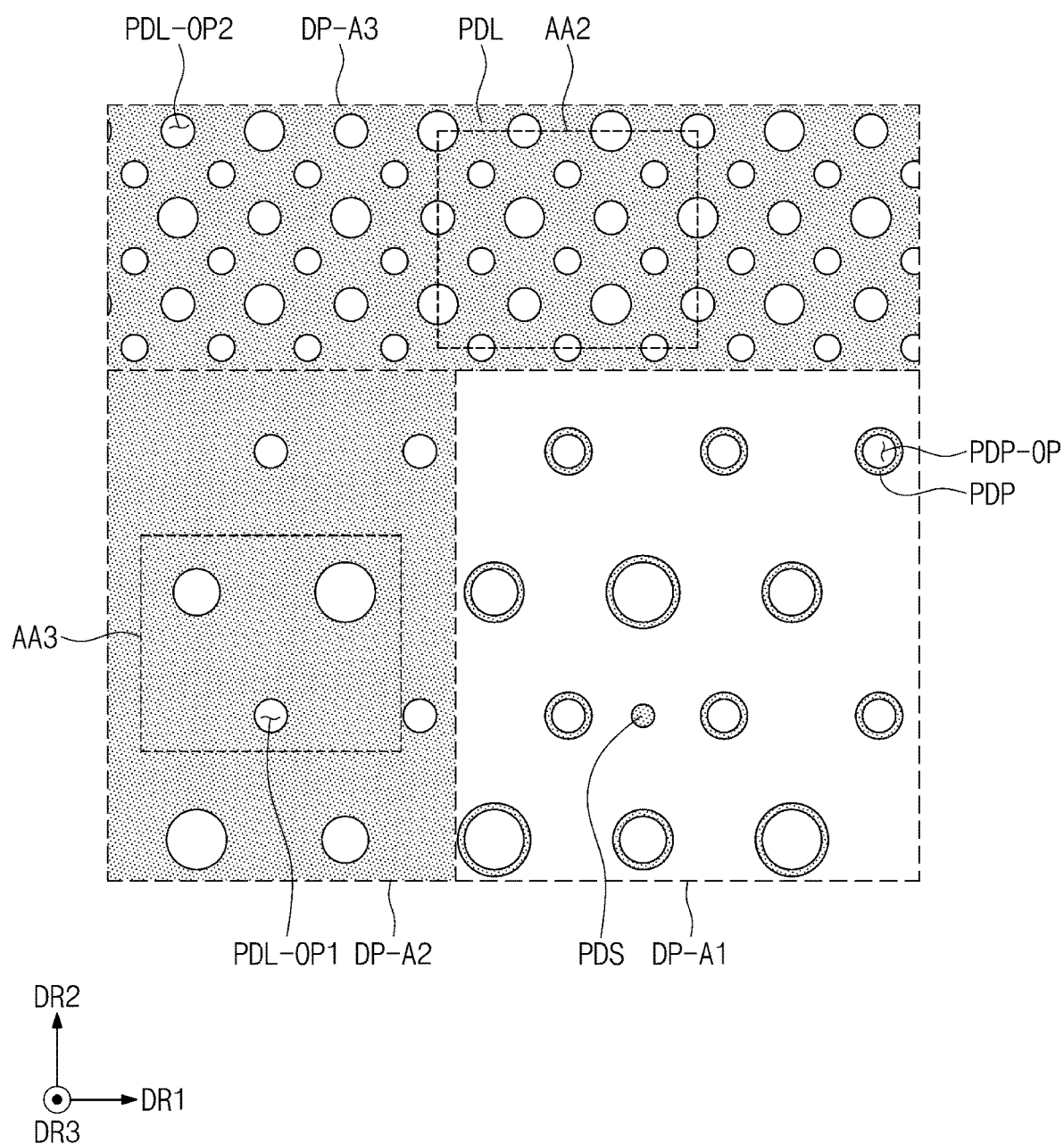
FIG. 8 is a plan view illustrating a pixel definition film and a pixel definition pattern according to an embodiment of the present inventive concept.

FIG. 8 is a plan view illustrating the pixel definition film PDL and the pixel definition pattern PDP according to an embodiment of the present inventive concept. For example, FIG. 8 illustrates the pixel definition film PDL, the pixel definition pattern PDP, and a spacer PDS disposed in a portion corresponding to region AA1 of FIG. 4.

Referring to FIG. 7B and FIG. 8, the pixel definition film PDL may be disposed in the second region DP-A2 and the third region DP-A3. The pixel definition film PDL might not overlap the first region DP-A1. Since the pixel definition film PDL having a color of black is not disposed in the first region DP-A1, the transmittance of the first region DP-A1 may be increased.

In the first region DP-A1, the pixel definition pattern PDP may be disposed. The pixel definition pattern PDP may be provided in plural, and the plurality of pixel definition patterns PDP may be disposed spaced apart from each other. In the pixel definition pattern PDP, an opening PDP-OP may be defined. The opening PDP-OP may be defined in a region overlapping the first pixel electrode AE1. For example, one pixel definition pattern PDP may have a shape which covers an edge of one first pixel electrode AE1. Therefore, when viewed on a plane, the pixel definition pattern PDP may have a circular ring shape.

In FIG. 8, one pixel definition pattern PDP is exemplarily illustrated as having a circular ring shape, but the shape of the pixel definition pattern PDP is not necessarily particularly limited thereto. For example, the pixel definition pattern PDP may be transformed into various forms such as an angled ring shape, a ring shape including a straight line, a ring shape including a straight line and a curve, an atypical ring shape, and the like.

The spacer PDS may be disposed in the first region DP-A1 and spaced apart from the pixel definition pattern PDP. The spacer PDS may also be disposed in the second region DP-A2 and the third region DP-A3. Within a unit area or the same area, the number of the spacers PDS disposed in the third region DP-A3 may be greater than the number of the spacers PDS disposed in the first region DP-A1. Within a unit area or the same area, the number of the spacers PDS disposed in the third region DP-A3 may be greater than the number of the spacers PDS disposed in the second region DP-A2. For example, the density of the spacers PDS disposed in the third region DP-A3 may be higher than each of the density of a spacer disposed in the first region DP-A1 and the density of a spacer disposed in the second region DP-A2. In addition, in an embodiment of the present inventive concept, the spacer PDS might not be disposed in the first region DP-A1. Alternatively, the spacer PDS might not be disposed in the first and second regions DP-A1 and DP-A2.

The thickness of the spacer PDS may be greater than the thickness of the pixel definition pattern PDP. Alternatively, the height of the spacer PDS may be greater than the height of the pixel definition pattern PDP. The spacer PDS may be single-layered or multi-layered. The spacer PDS may be composed of one layer having the same material as the pixel definition pattern PDP or may include a first layer having the same material as the pixel definition pattern PDP and a second layer disposed above the first layer.

The pixel definition pattern PDP and the spacer PDS may all include a black coloring agent. The black coloring agent may include a black dye or a black pigment. The black coloring agent may include a metal such as carbon black or chromium, or an oxide thereof. In an embodiment of the present inventive concept, the pixel definition pattern PDP may include a black coloring agent, and the spacer PDS might not include a black coloring agent.

Figure 9:
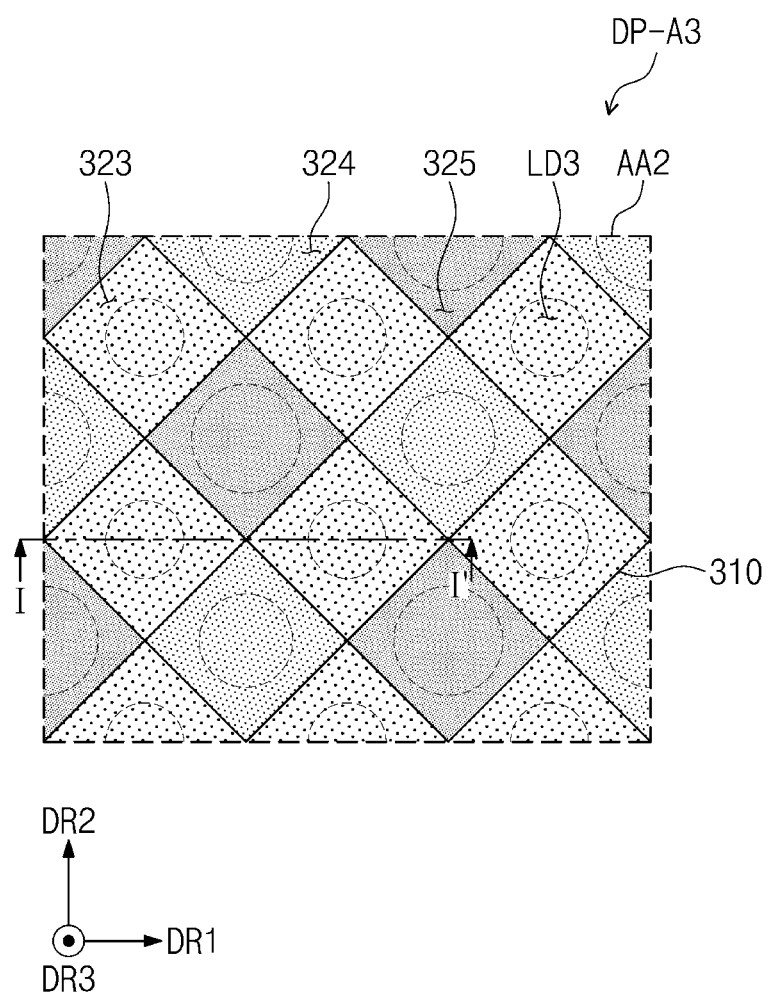
FIG. 9 is a plan view illustrating a light emission element and color filters disposed in a portion corresponding to region AA2 of FIG. 8 according to an embodiment of the present inventive concept.

FIG. 9 is a plan view illustrating a light emission element and color filters disposed in a portion corresponding to region AA2 of FIG. 8 according to an embodiment of the present inventive concept.

Referring to FIG. 7A and FIG. 9, in the third region DP-A3, the reflection prevention layer 300 may include the 3-1 color filter 323, a 3-2 (fourth) color filter 324, and a 3-3 (fifth) color filter 325 disposed on the third region light emission element LD3. The 3-1 color filter 323, the 3-2 color filter 324, and the 3-3 color filter 325 are each provided in plural, and when viewed on a plane, the plurality of the 3-1 color filters 323, the 3-2 color filters 324, and the 3-3 color filters 325 may be spaced apart from each other and might not overlap each other.

According to the present inventive concept, color filters which transmit the same color may each be arranged spaced apart from each other. For example, the 3-1 color filters 323 may be spaced apart from each other and might not be connected to each other, the 3-2 color filters 324 may be spaced apart from each other and might not be connected to each other, and the 3-3 color filters 325 may be spaced apart from each other and might not be connected to each other. In this case, the 3-3 color filters 325 might not be disposed between the 3-1 color filters 323 and the 3-2 color filters 324 adjacent to each other. Therefore, step non-uniformity caused by the overlapping of a color filter, which has a different color from color filters having two different colors, between the color filters may be mitigated. As a result, a stain generated by the step may be reduced or eliminated.

When viewed on a plane, the shape of each of the 3-1 color filter 323, the 3-2 color filter 324, and the 3-3 color filter 325 may be different from the shape of the third light emission element LD3. Alternatively, when viewed on a plane, the shape of each of the 3-1 color filter 323, the 3-2 color filter 324, and the 3-3 color filter 325 may be different from the shape of the second opening PDL-OP2 which exposes a portion of the third pixel electrode AE3. The 3-1 color filter 323, the 3-2 color filter 324, and the 3-3 color filter 325 may each have a rhombic shape. However, the shape of each of the 3-1 color filter 323, the 3-2 color filter 324, and the 3-3 color filter 325 is not necessarily limited thereto. For example, the 3-1 color filter 323, the 3-2 color filter 324, and the 3-3 color filter 325 may each have a polygonal shape, or an atypical shape.

The 3-1 color filter 323, the 3-2 color filter 324, and the 3-3 color filter 325 may transmit light of different colors from each other. The 3-1 color filter 323 may transmit light of any one color among red light, green light, and blue light, and the 3-2 color filter 324 and the 3-3 color filter 325 may transmit light of the other colors, respectively. The color of light transmitted by the 3-1 color filter 323, the 3-2 color filter 324, and the 3-3 color filter 325 is not necessarily limited thereto. Hereinafter, the 3-1 color filter 323 is described to transmit green light, the 3-2 color filter 324 is described to transmit red light, and the 3-3 color filter 325 is described to transmit blue light.

The 3-1 color filter 323 may overlap the third light emission element LD3 which emits green light. The 3-2 color filter 324 may overlap the third light emission element LD3 which emits red light. The 3-3 color filter 325 may overlap the third light emission element LD3 which emits blue light.

Figure 10:
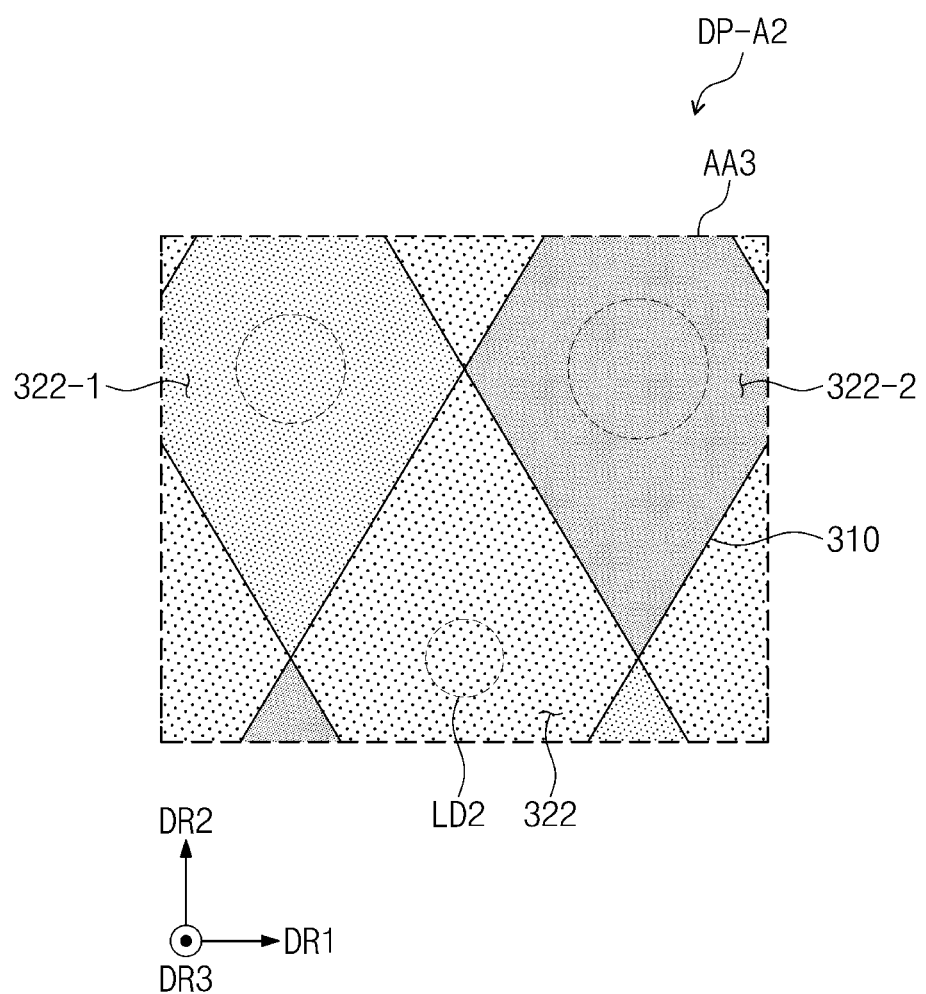
FIG. 10 is a plan view illustrating a light emission element and color filters disposed in a portion corresponding to region AA3 of FIG. 8 according to an embodiment of the present inventive concept.

FIG. 10 is a plan view illustrating a light emission element and color filters disposed in a portion corresponding to region AA3 of FIG. 8 according to an embodiment of the present inventive concept.

Referring to FIG. 10, the 2-1 color filter 322 of the second region DP-A2 may be provided in plural, and the shape of the 2-1 color filter 322 may be similar to the shape of the 3-1 color filter 323. For example, the shape of the 2-1 color filter 322 may be substantially the same as the shape of the 3-1 color filter 323, and the size of the 2-1 color filter 322 may be different from the size of the 3-1 color filter 323. For example, the 2-1 color filter 322 may have a rhombic shape. However, the shape of the 2-1 color filter 322 is not necessarily limited thereto. For example, the 2-1 color filter 322 may have a polygonal shape, or an atypical shape.

The plurality of the 2-1 color filters 322 may be spaced apart from each other and might not overlap each other. In the second region DP-A2, a 2-2 color filter 322-1 and a 2-3 color filter 322-2 adjacent to the 2-1 color filter 322 may be disposed.

The 2-1 color filter 322, the 2-2 color filter 322-1, and the 2-3 color filter 322-2 may transmit light of different colors from each other. The 2-1 color filter 322 may transmit light of any one color among red light, green light, and blue light, and the 2-2 color filter 322-1 and the 2-3 color filter 322-2 may transmit light of the other colors, respectively. The color of light transmitted by the 2-1 color filter 322, the 2-2 color filter 322-1, and the 2-3 color filter 322-2 is not necessarily limited thereto. Illustratively, the 2-1 color filter 322 may transmit green light, the 2-2 color filter 322-1 may transmit red light, and the 2-3 color filter 322-2 may transmit blue light.

Figure 11A:
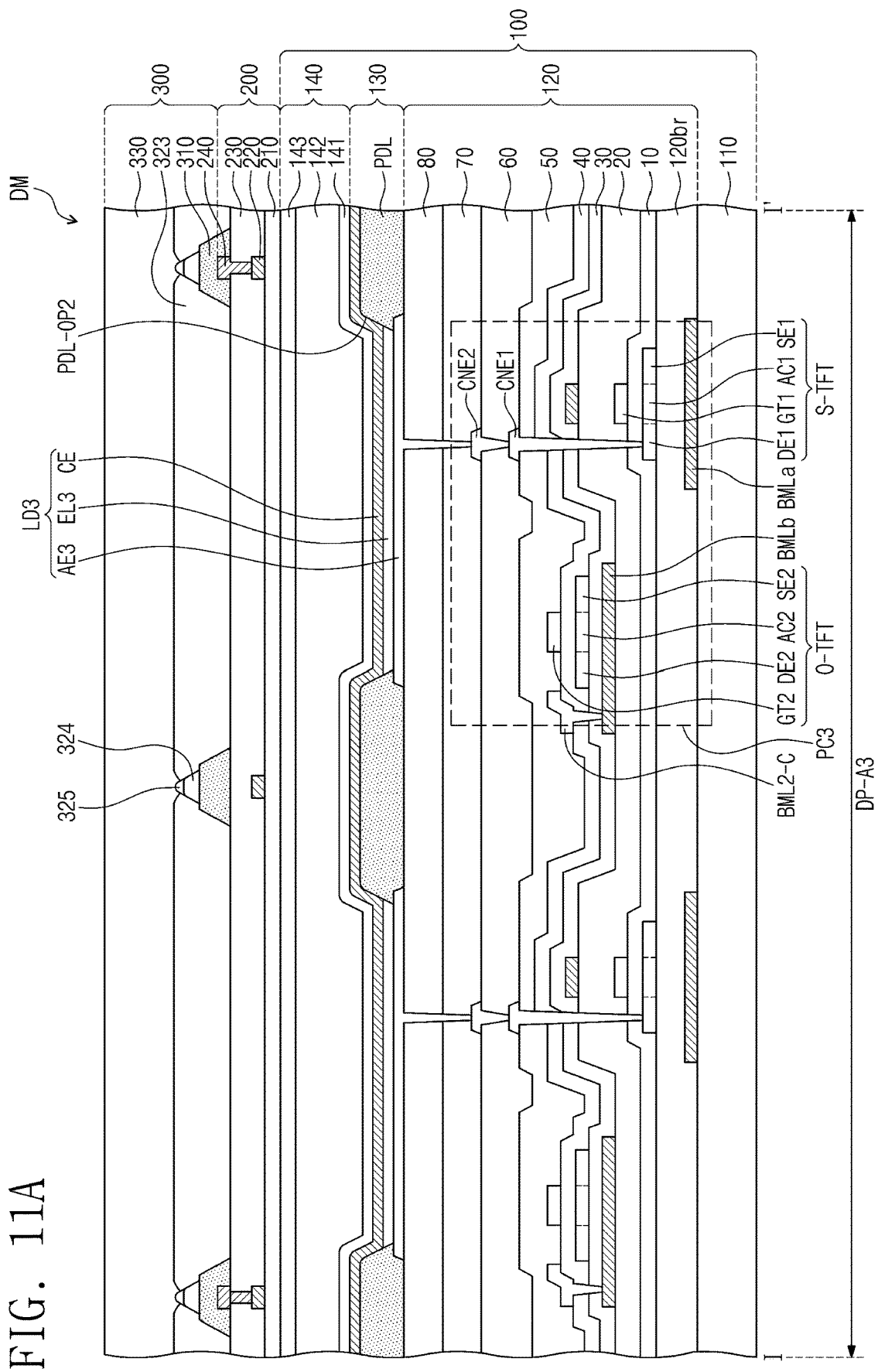
FIG. 11A is a cross-sectional view of a display module corresponding to line I-I' of FIG. 9 according to an embodiment of the present inventive concept.

FIG. 11A is a cross-sectional view of a display module corresponding to line I-I' of FIG. 9 according to an embodiment of the present inventive concept. In describing FIG. 11A, components which are the same as those of the display module DM illustrated in FIG. 7A are denoted by the same reference numerals, and to the extent that a detailed description of an element has been omitted, it may be assumed that the element is at least similar to a corresponding element that has been described elsewhere within the present disclosure.

Referring to FIG. 11A, the 3-2 color filter 324 and the 3-3 color filter 325 may be disposed above the black matrix 310. The 3-3 color filter 325 may be disposed above the 3-2 color filter 324, and the two may overlap each other.

The 3-2 color filter 324 and 3-3 color filter 325 may be disposed first, and then the 3-1 color filter 323 may be disposed. Due the 3-2 color filter 324 and the 3-3 color filter 325 overlapping each other on the black matrix 310, the 3-1 color filters 323 might not be adjacent to each other.

Color filters provided in plural and transmitting the same color may be spaced apart from each other without being connected to each other on the black matrix 310. For example, the 3-1 color filters 323 provided in plural may be spaced apart from each other, the 3-2 color filters 324 provided in plural may be spaced apart from each other, and the 3-3 color filters 325 provided in plural may be spaced apart from each other.

Unlike in an embodiment of the present inventive concept, when color filters which transmit the same predetermined color are connected to each other, a stain may be generated by a step occurring in a portion for connecting the color filters which transmit the same predetermined color. However, according to an embodiment of the present inventive concept, color filters which transmit the same color may all be disposed spaced apart. Therefore, step non-uniformity caused by the overlapping of color filters may be mitigated, and a stain generated by the step may be reduced or eliminated.

In FIG. 11A, an example in which the 3-2 color filter 324 and the 3-3 color filter 325 are all disposed between adjacent 3-1 color filters 323 is described. However, the embodiment of the present inventive concept is not necessarily limited thereto. For example, on the black matrix 310 between adjacent 3-1 color filters 323, only the 3-2 color filter 324 may be disposed, only the 3-3 color filter 325 may be disposed, or both the 3-2 color filter 324 and the 3-3 color filter 325 might not be disposed. Alternatively, on the black matrix 310 between adjacent 3-1 color filters 323, the 3-2 color filter 324 and the 3-3 color filter 325 may be disposed side by side. For example, the 3-2 color filter 324 and 3-3 color filter 325 may be disposed on the same layer, e.g., on an upper surface of the black matrix 310. In addition, unlike what is illustrated in FIG. 11A, it may be disposed in the order of the 3-3 color filter 325, the 3-2 color filter 324, and the 3-1 color filter 323.

Figure 11B:
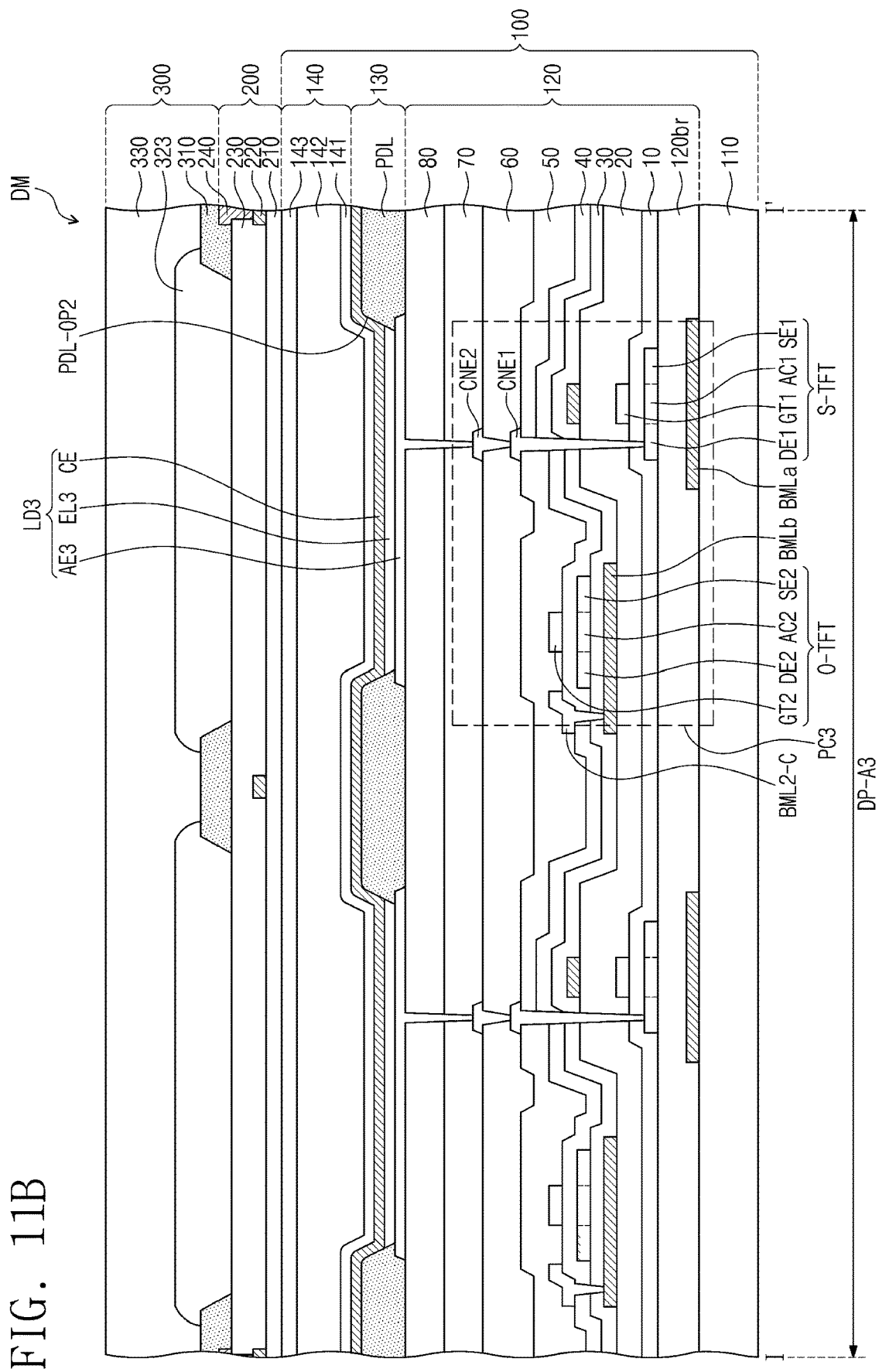
FIG. 11B is a cross-sectional view of a display module corresponding to line I-I' of FIG. 9 according to an embodiment of the present inventive concept.

FIG. 11B is a cross-sectional view of a display module corresponding to line I-I' of FIG. 9 according to an embodiment of the present inventive concept.

Referring to FIG. 11B, when viewed on a plane, the area or width of the black matrix 310 disposed on the sensor layer 200 may be greater than the area or width of the black matrix 310 illustrated in FIG. 11A. Edges of the 3-1 color filters 323 which transmit the same color may be spaced apart from each other on the black matrix 310. The 3-2 color filter 324 (see FIG. 9) and the 3-3 color filter 325 (see FIG. 9) adjacent to each other might not be adjacent to each other on the black matrix 310 as in the case of the 3-1 color filter 323.

According to an embodiment of the present inventive concept, color filters may be provided in an island form, and may be spaced apart from each other. Therefore, the color filters might not overlap each other, and step non-uniformity caused by the overlapping of the color filters may be mitigated. As a result, a stain generated by the step may be reduced or eliminated.

Figure 12A:
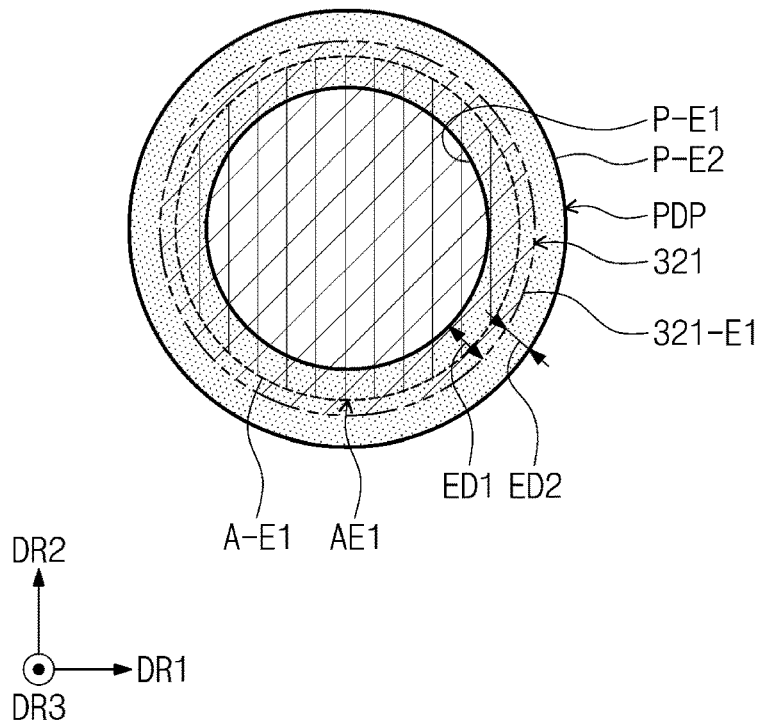
FIG. 12A is a plan view illustrating components of a display module according to an embodiment of the present inventive concept.
Figure 12B:
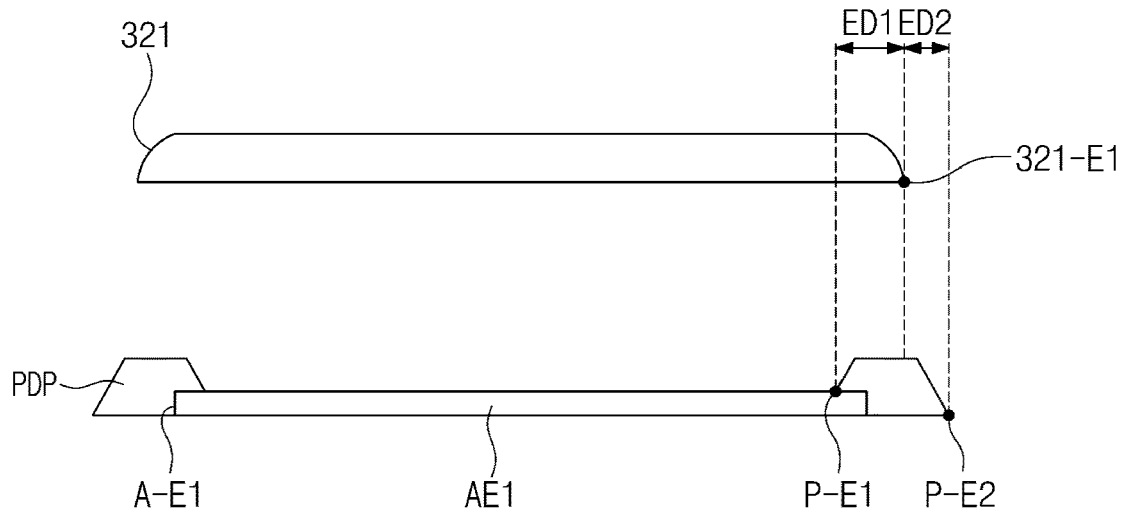
FIG. 12B is a cross-sectional view illustrating components of a display module according to an embodiment of the present inventive concept.

FIG. 12A is a plan view illustrating components of a display module according to an embodiment of the present inventive concept. FIG. 12B is a cross-sectional view illustrating components of a display module according to an embodiment of the present inventive concept.

Referring to FIG. 12A and FIG. 12B, the first pixel electrode AE1, the pixel definition pattern PDP, and the 1-1 color filter 321 are illustrated.

The shape of the first pixel electrode AE1 on a plane may be circular, elliptical, partially circular, or partially elliptical. In this case, the diffraction of light passing through the transmissive region TA (see FIG. 7B) may be minimized.

In FIG. 12A, it is exemplarily illustrated that the first pixel electrode AE1 is circular, and an edge A-E1 of the first pixel electrode AE1 includes a curve. The pixel definition pattern PDP may cover the edge A-E1 of the first pixel electrode AE1. The pixel definition pattern PDP may have a ring shape which is similar to the shape of the edge A-E1 of the first pixel electrode AE1.

The pixel definition pattern PDP may include a first edge P-E1 overlapping the first pixel electrode AE1 and a second edge P-E2 not overlapping the first pixel electrode AE1. The second edge P-E2 may surround the first edge P-E1. The first edge P-E1 of the pixel definition pattern PDP and the second edge P-E2 of the pixel definition pattern PDP may each include a curve.

When viewed from the third direction DR3, an edge 321-E1 of the 1-1 color filter 321 may overlap the pixel definition pattern PDP. For example, the edge 321-E1 of the 1-1 color filter 321 may be disposed between the first edge P-E1 of the pixel definition pattern PDP and the second edge P-E2 of the pixel definition pattern PDP.

Light emitted from the first light emission layer EL1 (see FIG. 7B) and output to the outside may transmit the 1-1 color filter 321. In addition, light output from the electronic module CM (see FIG. 2) or light incident on the electronic module CM should not transmit the 1-1 color filter 321.

To meet the above conditions, a first distance ED1 between the edge 321-E1 of the 1-1 color filter 321 and the first edge P-E1 of the pixel definition pattern PDP may be greater than a second distance ED2 between the edge 321-E1 of the 1-1 color filter 321 and the first edge P-E1 of the pixel definition pattern PDP. Therefore, the display module DM (see FIG. 7B) may provide an image of high quality, and the quality of a signal obtained in the electronic module CM or a signal output from the electronic module CM may be increased.

For example, the first distance ED1 may be two times or greater than the second distance ED2. However, this is a numerical value which may be changed according to the distance between the 1-1 color filter 321 and the pixel definition pattern PDP, and thus, is not necessarily particularly limited thereto.

Figure 13A:
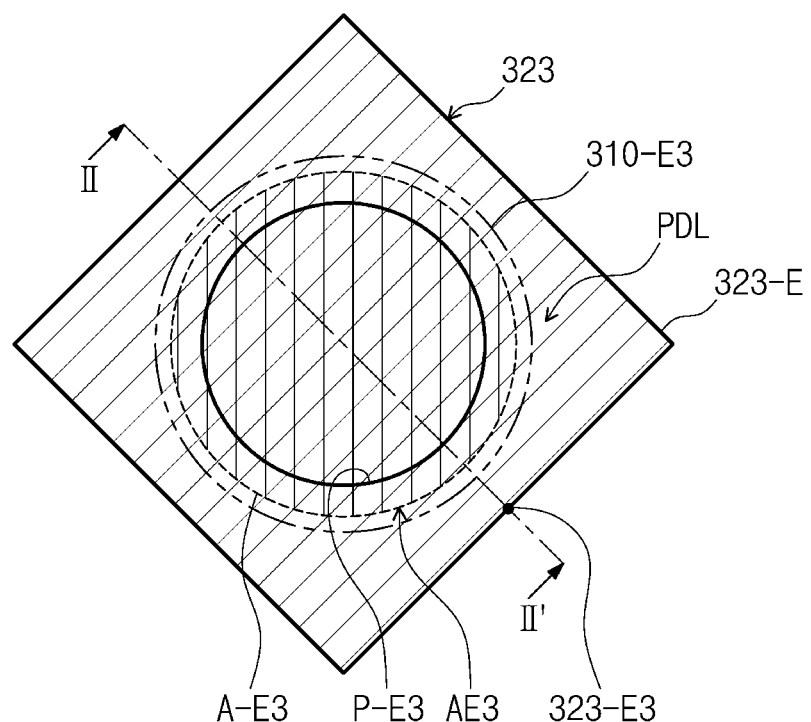
FIG. 13A is a plan view illustrating components of a display module according to an embodiment of the present inventive concept.
Figure 13B:
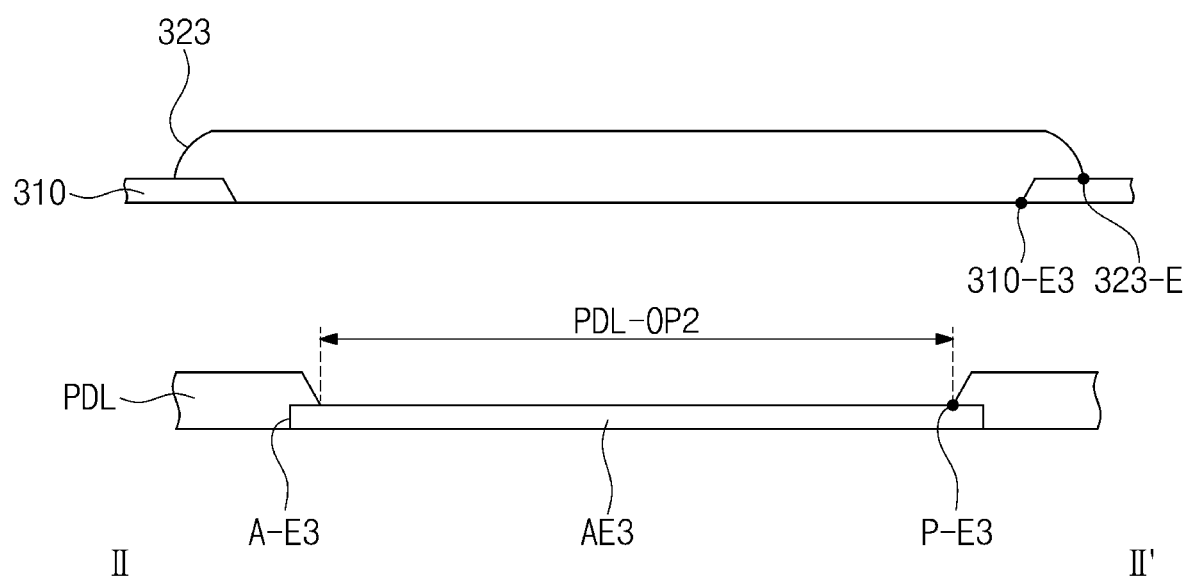
FIG. 13B is a cross-sectional view of line II-II' of FIG. 13A.

FIG. 13A is a plan view illustrating components of a display module according to an embodiment of the present inventive concept. FIG. 13B is a cross-sectional view of line II-II' of FIG. 13A.

In FIG. 13A, the third pixel electrode AE3 and the 3-1 color filter 323 are illustrated, and in FIG. 13B, the third pixel electrode AE3, the pixel definition film PDL, the black matrix 310, and the 3-1 color filter 323 are illustrated. In addition, in FIG. 13A, a third edge P-E3 which defines the second opening PDL-OP2 of the pixel definition film PDL and an edge 310-E3 of the black matrix 310 are further displayed.

The shape of the third pixel electrode AE3 on a plane may be circular, elliptical, partially circular, or partially elliptical. An edge A-E3 of the third pixel electrode AE3 may include a curve. The pixel definition film PDL may cover the edge A-E3 of the third pixel electrode AE3. On the pixel definition film PDL, the second opening PDL-OP2 having a similar shape to the shape of the edge A-E3 of the third pixel electrode AE3 may be defined.

The pixel definition film PDL may include the third edge P-E3 which defines the second opening PDL-OP2 and which is in contact with the third pixel electrode AE3. The third edge P-E3 of the pixel definition film PDL may include a curve.

The black matrix 310 may include the edge 310-E3 which defines the second partition opening 310-OP2. When viewed from the third direction DR3, the edge 310-E3 of the black matrix 310 may overlap the pixel definition film PDL. When viewed from the third direction DR3, the edge 310-E3 of the black matrix 310 may surround the third edge P-E3 of the pixel definition film PDL. The area of the second partition opening 310-OP2 may be greater than the area of the second opening PDL-OP2.

An edge 323-E of the 3-1 color filter 323 may have a different shape from the third edge P-E3 of the pixel definition film PDL. For example, the third edge P-E3 may have a circular shape, and the edge 323-E of the 3-1 color filter 323 may have a polygonal shape. For example, when viewed on a plane, if the 3-1 color filter 323 has a shape which completely covers the second opening PDL-OP2 in the pixel definition film PDL, it may be transformed into various shapes.

Figure 14A:
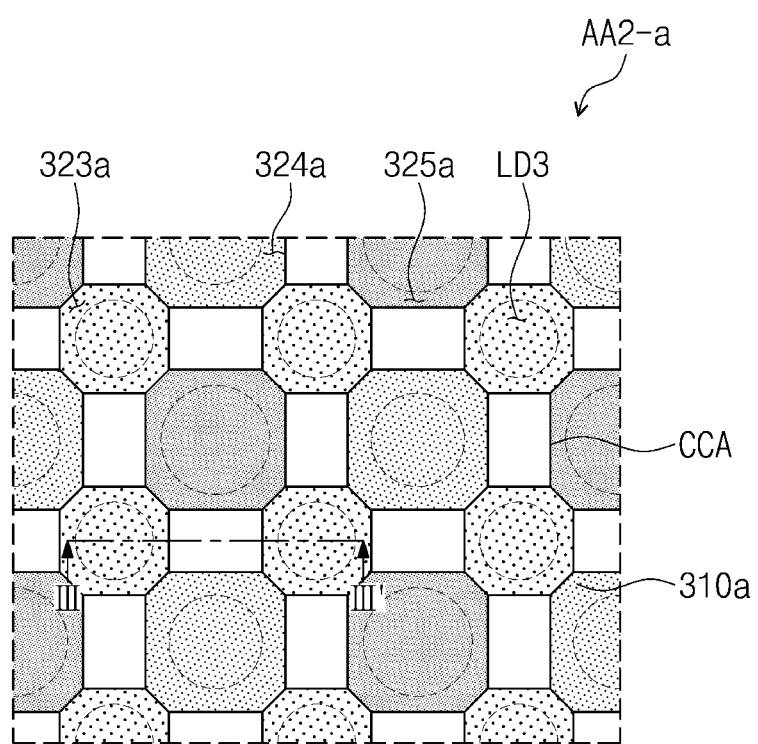
FIG. 14A is a plan view illustrating a light emission element and color filters disposed in a portion corresponding to a third region according to an embodiment of the present inventive concept.
Figure 14B:
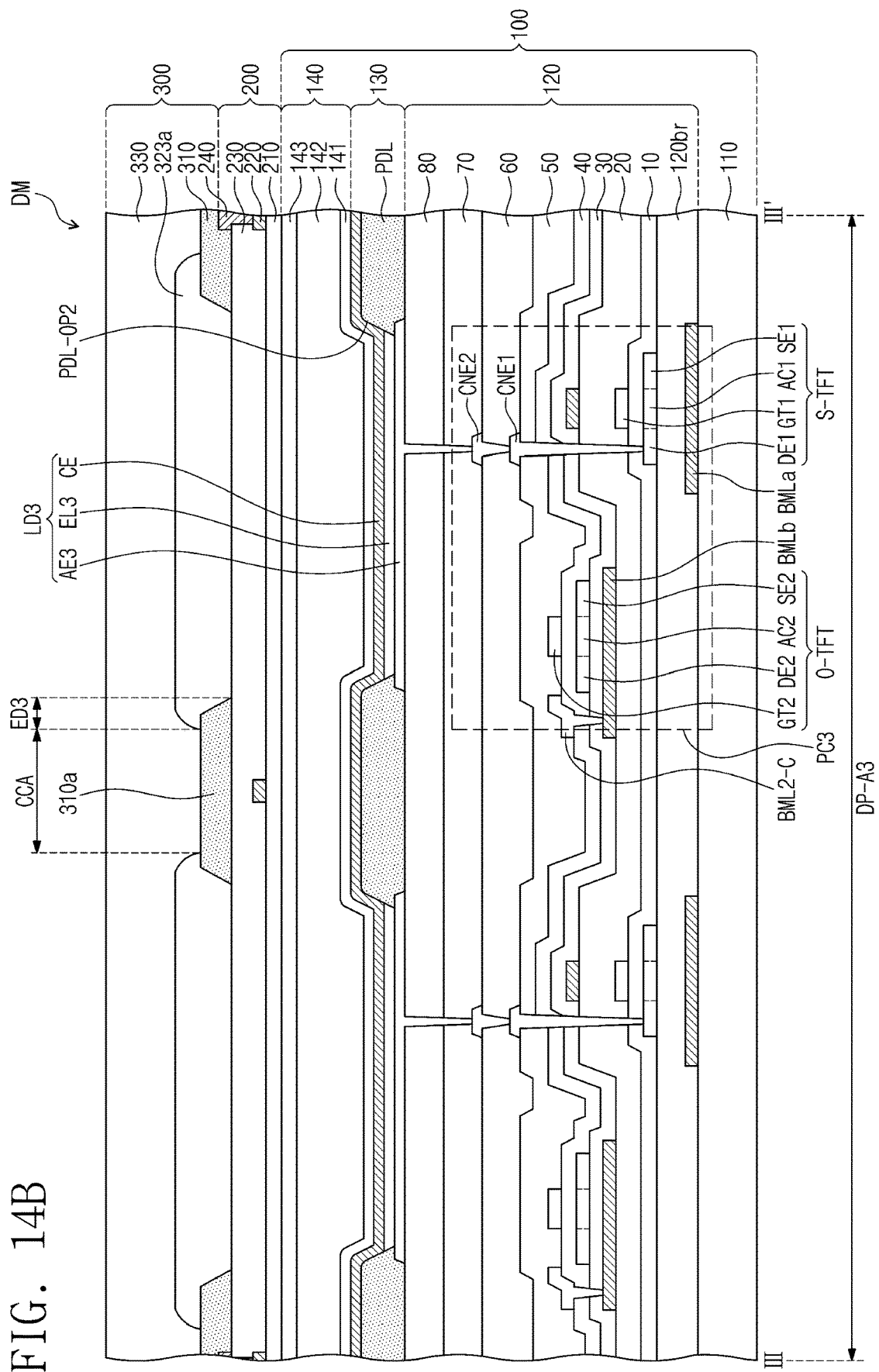
FIG. 14B is a cross-sectional view of a display module corresponding to line III-III' of FIG. 14A.

FIG. 14A is a plan view illustrating a light emission element and color filters disposed in a portion Aa2-*a* corresponding to a third region according to an embodiment of the present inventive concept. FIG. 14B is a cross-sectional view of a display module corresponding to line of FIG. 14A.

Referring to FIG. 14A and FIG. 14B, a 3-1 color filter 323*a*, a 3-2 color filter 324*a*, and a 3-3 color filter 325*a* which respectively cover the third pixel electrodes AE3 may be disposed. The 3-1 color filter 323*a*, the 3-2 color filter 324*a*, and the 3-3 color filter 325*a* may each transmit light of any one color among red light, green light, and blue light.

The 3-1 color filter 323*a*, the 3-2 color filter 324*a*, and the 3-3 color filter 325*a* may transmit the same color as the emission color of the third light emission element LD3 which they respectively cover. Illustratively, the 3-1 color filter 323*a* may transmit green light, the 3-2 color filter 324*a* may transmit red light, and the 3-3 color filter 325*a* may transmit blue light.

The 3-2 color filter 324*a* and the 3-3 color filter 325*a* may each be provided in plural, and when viewed on a plane, the area of the 3-2 color filter 324*a* and the area of the 3-3 color filter 325*a* may be the same.

The 3-1 color filter 323*a* is provided in plural, and each of the 3-1 color filters 323*a* may be in contact with the 3-2 color filters 324*a* and the 3-3 color filters 325*a*. In addition, the 3-1 color filters 323*a* may be spaced apart from each other.

Each of the 3-1 color filters 323*a* may have a size which does not allow the same to overlap the 3-2 color filter 324*a* and the 3-3 color filter 325*a*. In this case, a minimum distance between an edge of the 3-1 color filter 323*a* and an edge which defines a partition opening of a black matrix 310*a* may be equal to or greater than a predetermined distance. For example, even though the size of each of the 3-1 color filters 323*a* is adjusted, since a minimum distance between an edge of the 3-1 color filter 323*a* and an edge which defines a partition opening of the black matrix 310*a* is designed to be equal to or greater than a predetermined distance, a phenomenon in which the 3-1 color filter 323*a* does not sufficiently cover the partition opening may be prevented. The minimum distance may be 2.6 micrometers or more but is not necessarily particularly limited thereto.

A plurality of color control regions CCA may be defined between the 3-1 color filters 323*a*, the 3-2 color filters 324*a*, and the 3-3 color filters 325*a*. The plurality of color control regions CCA may be a region which overlaps the third region DP-A3 (see FIG. 9) and which does not overlap the third light emission element LD3.

The plurality of color control regions CCA may be a region on a portion of the black matrix 310*a* in which the 3-1 color filters 323*a*, the 3-2 color filters 324*a*, and the 3-3 color filters 325*a* are not disposed.

When viewed on a plane, the color control regions CCA surrounded by the 3-1 color filters 323*a*, the 3-2 color filters 324*a*, and the 3-3 color filters 325*a* might not overlap the 3-1 color filters 323*a*, the 3-2 color filters 324*a*, and the 3-3 color filters 325*a*.

When viewed on a plane, the size of each of the color control regions CCA may be the same. To adjust the size of each of the color control regions CCA, a portion of each of the 3-1 color filters 323*a*, the 3-2 color filters 324*a*, and the 3-3 color filters 325*a* may be removed.

According to an embodiment of the present inventive concept, color filters may be provided in an island form, and may be spaced apart from each other. Particularly, color filters which transmit light of the same color might not be connected to each other. For example, the 3-3 color filters 325*a* might not be disposed in a portion in which the 3-1 color filters 323*a* and the 3-2 color filters 324*a* are in contact with. In addition, the 3-2 color filters 324*a* might not be disposed in a portion in which the 3-1 color filters 323*a* and the 3-3 color filters 325*a* are in contact with. Therefore, step non-uniformity caused by the overlapping of color filters may be mitigated, and a stain generated by the step may be reduced or eliminated.

In an embodiment of the present inventive concept, the 3-1 color filters 323*a*, the 3-2 color filters 324*a*, and/or the 3-3 color filters 325*a* may overlap the color control regions CCA. For example, color filters may be further disposed in the color control regions CCA to control the color of external light as it is reflected. Therefore, by controlling the color of external light as it is reflected such that the color of external light as it is reflected is not shifted to a specific color, a more pure black color may be visually recognized when the electronic device 100 (see FIG. 1) is turned off. Hereinafter, embodiments in which color filters are further disposed in the color control regions CCA are described in detail.

Figure 15:
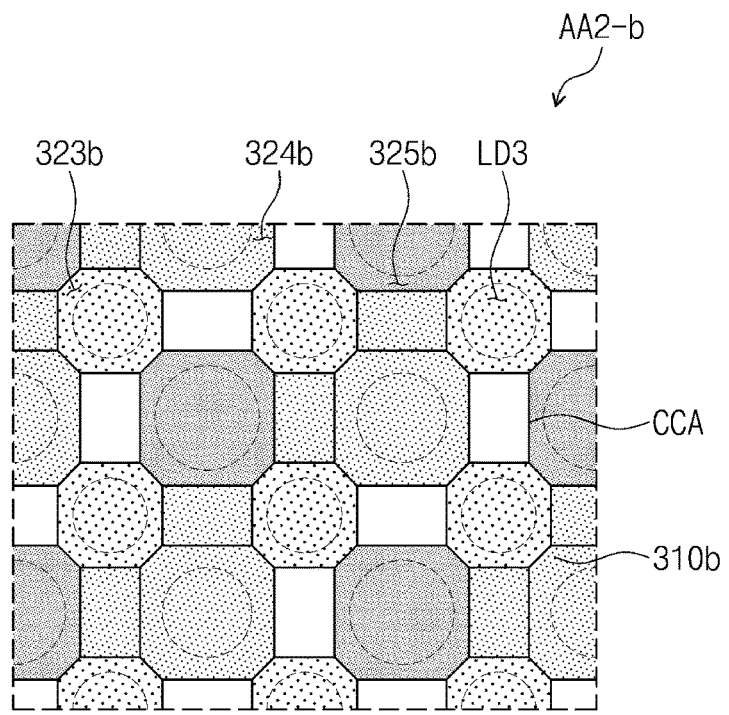
FIG. 15 is a plan view illustrating a light emission element and color filters disposed in a portion corresponding to a third region according to an embodiment of the present inventive concept.

FIG. 15 is a plan view illustrating a light emission element and color filters disposed in a portion Aa2-*b* corresponding to a third region according to an embodiment of the present inventive concept.

Referring to FIG. 15, illustratively, 3-1 color filters 323*b* may transmit green light, 3-2 color filters 324*b* may transmit red light, and 3-3 color filters 325*b* may transmit blue light.

When viewed on a plane, the 3-2 color filters 324*b* may overlap portions of the color control regions CCA.

Since the area of a region in which the 3-2 color filters 324*b* which transmit red light is increased, the color of external light as reflected may be more red than when the 3-2 color filters 324*b* are not disposed in the color control regions CCA. However, the embodiment of the present inventive concept is not necessarily limited thereto. The 3-1 color filters 323*b* or the 3-3 color filters 325*b* may be disposed in portions of the color control regions CCA. In each case, the color of external light as reflected may be more greenish or more blue than when the 3-1 color filters 323*b* or the 3-3 color filters 325*b* are not disposed in the color control regions CCA.

Figure 16:
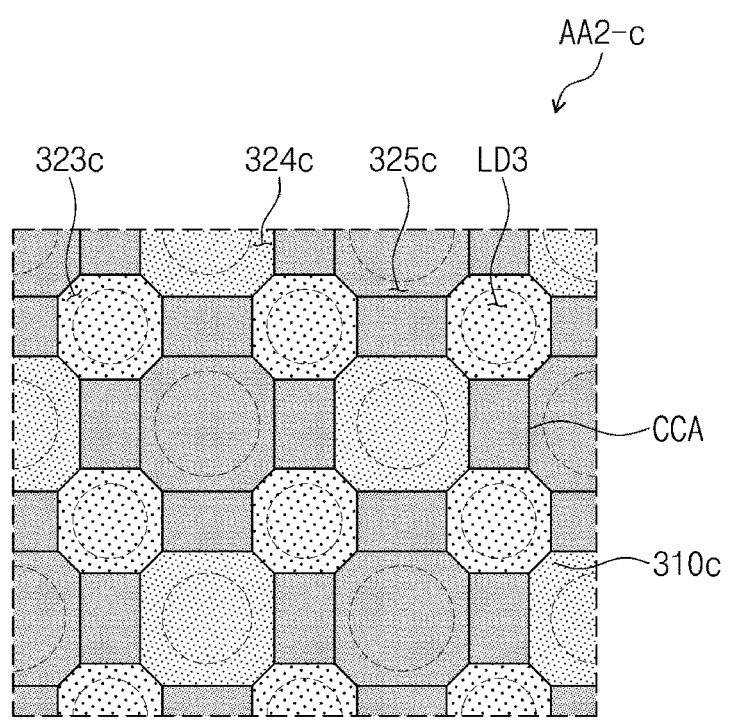
FIG. 16 is a plan view illustrating a light emission element and color filters disposed in a portion corresponding to a third region according to an embodiment of the present inventive concept.

FIG. 16 is a plan view illustrating a light emission element and color filters disposed in a portion Aa2-*c* corresponding to a third region according to an embodiment of the present inventive concept.

Referring to FIG. 16, illustratively, 3-1 color filters 323*c* may transmit green light, 3-2 color filters 324*c* may transmit red light, and 3-3 color filters 325*c* may transmit blue light.

When viewed on a plane, the 3-3 color filters 325*c* may overlap the color control regions CCA on a black matrix 310*c*.

Since a region of the 3-3 color filters 325*c* which transmit blue light is increased, the color of external light as reflected may be more blue than when the 3-3 color filters 325*c* are not disposed in the color control regions CCA.

Figure 17:
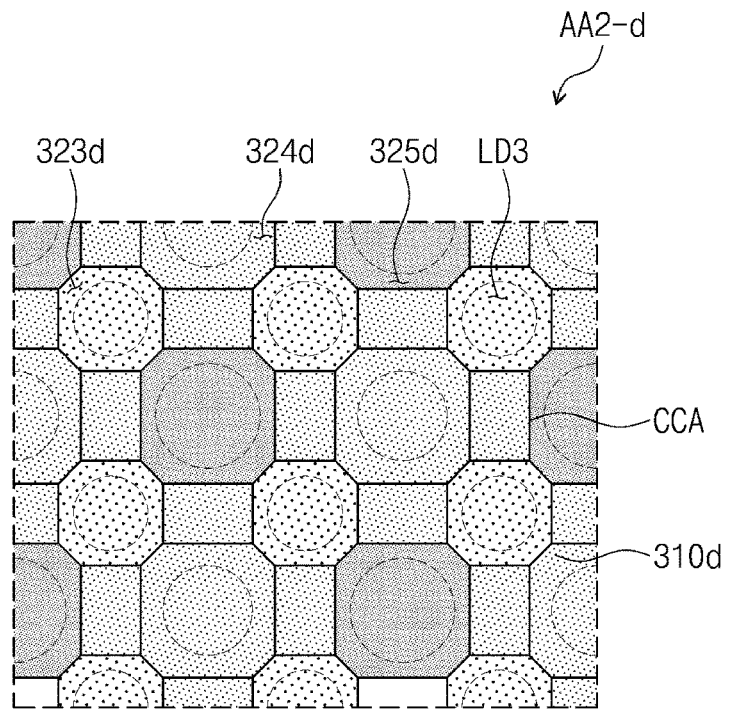
FIG. 17 is a plan view illustrating a light emission element and color filters disposed in a portion corresponding to a third region according to an embodiment of the present inventive concept.

FIG. 17 is a plan view illustrating a light emission element and color filters disposed in a portion Aa2-*d* corresponding to a third region according to an embodiment of the present inventive concept.

Referring to FIG. 17, illustratively, 3-1 color filters 323*d* may transmit green light, 3-2 color filters 324*d* may transmit red light, and 3-3 color filters 325*d* may transmit blue light.

When viewed on a plane, the 3-2 color filters 324*d* may overlap the color control regions CCA on a black matrix 310*d*.

Since a region of the 3-2 color filters 324*b* which transmit red light is increased, the color of external light as reflected may be more red than when the 3-2 color filters 324*b* are not disposed in the color control regions CCA.

Figure 18:
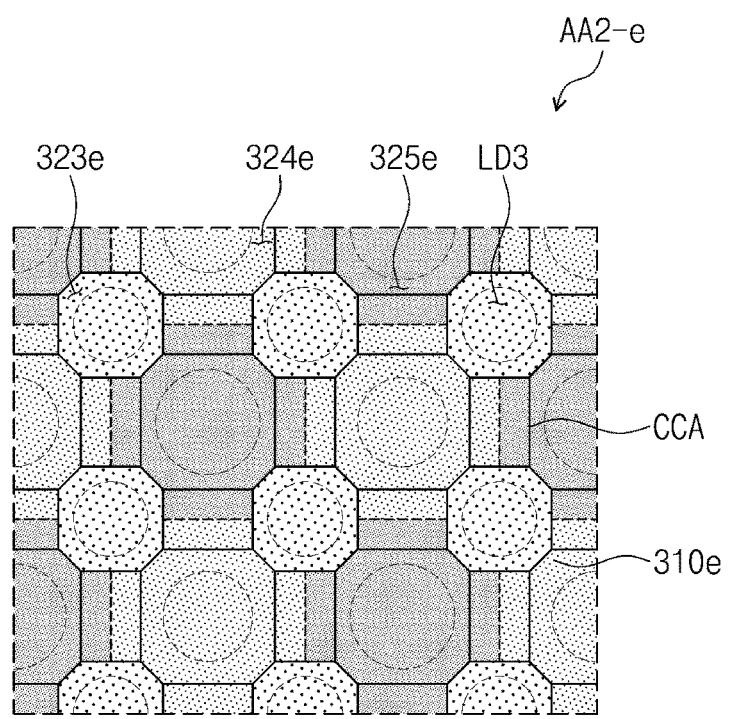
FIG. 18 is a plan view illustrating a light emission element and color filters disposed in a portion corresponding to a third region according to an embodiment of the present inventive concept.

FIG. 18 is a plan view illustrating a light emission element and color filters disposed in a portion Aa2-*e* corresponding to a third region according to an embodiment of the present inventive concept.

Referring to FIG. 18, illustratively, 3-1 color filters 323*e* may transmit green light, 3-2 color filters 324*e* may transmit red light, and 3-3 color filters 325*e* may transmit blue light.

When viewed on a plane, the 3-2 color filter 324*e* may overlap a first portion of the color control region CCA on a black matrix 310*e*, and the 3-3 color filter 325*e* may overlap the remaining second portion of the color control region CCA. One light emission element LD3 overlapping the 3-2 color filter 324*e* may be adjacent to first portions of four color control regions CCA. One light emission element LD3 overlapping the 3-3 color filter 325*e* may be adjacent to second portions of four color control regions CCA.

Figure 19:
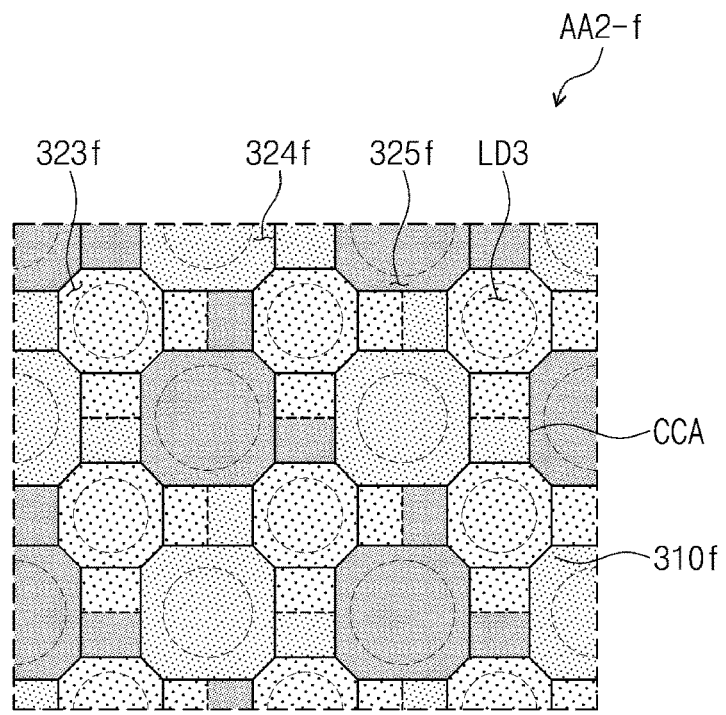
FIG. 19 is a plan view illustrating a light emission element and color filters disposed in a portion corresponding to a third region according to an embodiment of the present inventive concept.

FIG. 19 is a plan view illustrating a light emission element and color filters disposed in a portion AA2-*f* corresponding to a third region according to an embodiment of the present inventive concept.

Referring to FIG. 19, illustratively, 3-1 color filters 323*f* may transmit green light, 3-2 color filters 324*f* may transmit red light, and 3-3 color filters 325*f* may transmit blue light.

When viewed on a plane, two types of color filters among the 3-1 color filters 323*f*, the 3-2 color filters 324*f*, and 3-3 color filters 325*f* may overlap each of the color control regions CCA on a black matrix 310*f*. However, color filters which respectively overlap light emission elements transmitting light of the same color through the color control region CCA might not be connected to each other.

The area of each of the 3-1 color filters 323*f* which transmit green light, the 3-2 color filters 324*f* which transmit red light, and the 3-3 color filters 325*f* which transmit blue light may be adjusted to control the color of external light as reflected.

Figure 20:
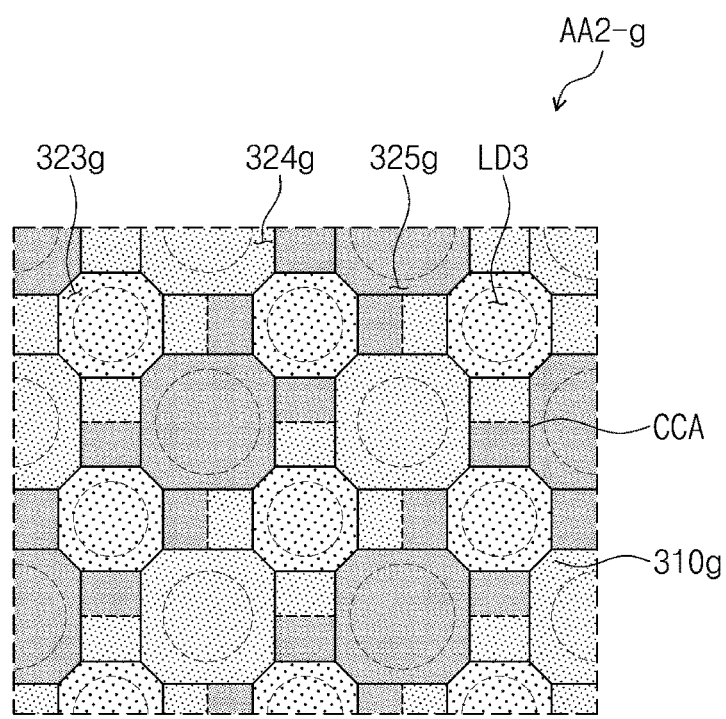
FIG. 20 is a plan view illustrating a light emission element and color filters disposed in a portion corresponding to a third region according to an embodiment of the present inventive concept.

FIG. 20 is a plan view illustrating a light emission element and color filters disposed in a portion AA2-*g* corresponding to a third region according to an embodiment of the present inventive concept.

Referring to FIG. 20, illustratively, 3-1 color filters 323*g* may transmit green light, 3-2 color filters 324*g* may transmit red light, and 3-3 color filters 325*g* may transmit blue light.

When viewed on a plane, the 3-2 color filter 324*g* may overlap a first portion of the color control region CCA on a black matrix 310*g*, and the 3-3 color filter 325*g* may overlap the remaining second portion of the color control region CCA.

Any one 3-1 color filter 323*g* may be adjacent to first portions of four color control regions CCA in which the 3-2 color filters 324*g* are disposed, and another 3-1 color filter 323*g* may be adjacent to second portions of four color control regions in which the 3-3 color filters 325*g* are disposed.

Depending on the area of each of the 3-2 color filters 324*g* which transmit red light, and the 3-3 color filters 325*g* which transmit blue light, the color of external light as reflected may be controlled.

According to the above description, the shape of a color filter overlapping a first region of a display panel may be configured to be different from the shape of a color filter overlapping a second region and a third region of the display panel. To increase the transmittance of light through the first region as compared to the transmittance of light through the second region and the third region, the shape of a color filter in the first region may be different from the shape of a color filter in the second region and a color filter of the third region.

In addition, in the second region and the third region, color filters which transmit the same color may be arranged spaced apart from each other. For example, the color filters may be provided in an island form. In this case, when a color filter which transmits a first color and a color filter which transmits a second color are adjacent to each other, a color filter which transmits a third color might not be disposed between the color filters which transmit the first color and the second color. Therefore, step non-uniformity caused by the overlapping of color filters may be mitigated, and a stain generated by the step may be reduced or eliminated.

In addition, the arrangement ratio of color filters may be adjusted to control the color of external light as reflected. Therefore, the color of black visually recognized when an electronic device is turned off might not be shifted to a specific color, but may be closer to pure black.

Although various embodiments of the present disclosure have been described with reference to the figures, it will be understood by those skilled in the art that various modifications and changes in form and details may be made therein without departing from the spirit and scope of the present invention. Accordingly, the technical scope of the present inventive concept is not necessarily intended to be limited to the contents set forth in the detailed description of the specification.

What is claimed is:

1. An electronic device, comprising:
    a display panel including a first region, a second region adjacent to the first region, and a third region surrounding at least a portion of the second region; and
    an optical layer disposed on the display panel,
    wherein the display panel includes:
        a first pixel including a first light emission element disposed in the first region and a first pixel circuit connected to the first light emission element and disposed in the second region;
        a second pixel including a second light emission element disposed in the second region and a second pixel circuit electrically connected to the second light emission element and disposed in the second region; and
        a third pixel including a third light emission element disposed in the third region and a third pixel circuit electrically connected to the third light emission element and disposed in the third region, and
    the optical layer includes:
        a first color filter overlapping the first light emission element;
        a second color filter overlapping the second light emission element; and
        a third color filter overlapping the third light emission element,
    wherein the first color filter, the second color filter, and the third color filter transmit light of the same color, and a shape of the first color filter is different from a shape of the second color filter and a shape of the third color filter.

2. The electronic device of claim 1, wherein the display panel further comprises:

a pixel definition pattern disposed in the first region, and including an opening for disposing the first light emission element; and a pixel definition film disposed in the second region and the third region, and including a first opening and a second opening for respectively disposing the second light emission element and the third light emission element.

3. The electronic device of claim 2, wherein the shape of the first color filter corresponds to the shape of the first light emission element.

4. The electronic device of claim 3, wherein an edge of the first color filter and the opening each have a curve.

5. The electronic device of claim 3, wherein:
the shape of the second color filter is different from the shape of the second light emission element; and
the shape of the third color filter is different from the shape of the third light emission element.

6. The electronic device of claim 5, wherein:
the first color filter has a circular shape; and
each of the second color filter and the third color filter has a polygonal shape.

7. The electronic device of claim 2, wherein the first opening and the second opening each have a curve.

8. The electronic device of claim 2, wherein the optical layer further comprises a black matrix overlapping the pixel definition film, wherein the black matrix has a first partition opening overlapping the first opening and a second partition opening overlapping the second opening, and the second color filter is disposed in the first partition opening and the third color filter is disposed in the second partition opening.

9. The electronic device of claim 8, wherein:
an area of the first partition opening is greater than an area of the first opening; and
an area of the second partition opening is greater than an area of the second opening.

10. The electronic device of claim 1, wherein an area of a first pixel electrode of the first light emission element is greater than an area of a third pixel electrode of the third light emission element.

11. The electronic device of claim 1, wherein the display panel further comprises a connection line electrically connecting the first light emission element and the first pixel circuit to each other, wherein the connection line includes a light transmissive material.

12. The electronic device of claim 11, wherein the first region includes a transmissive region and an element region, the first light emission element overlaps the element region, and at least a portion of the connection line overlaps the transmissive region.

13. The electronic device of claim 1, wherein the shape of the second color filter and the shape of the third color filter are substantially the same.

14. The electronic device of claim 1, wherein:
the first pixel, the second pixel, and the third pixel are each provided in plural; and
the first color filter, the second color filter, and the third color filter are each provided in plural,
wherein the first color filters of the plurality of first color filters are spaced apart from each other and do not overlap each other, the second color filters of the plurality of second color filters are spaced apart from each other and do not overlap each other, and the third color filters of the plurality of third color filters are spaced apart from each other and do not overlap each other.

15. The electronic device of claim 1, wherein the optical layer further comprises a fourth color filter and a fifth color filter that overlap the third region, wherein the third color filter, the fourth color filter, and the fifth color filter transmit different colors from each other.

16. The electronic device of claim 15, wherein the third color filter is in contact with the fourth color filter and the fifth color filter, and
wherein the third color filters is provided in plural, wherein the plurality of third color filters are spaced apart from each other by the fourth color filter and the fifth color filter.

17. The electronic device of claim 16, wherein the optical layer includes a color control region which overlaps the third region and does not overlap a light emission region of the third light emission element,
wherein, an area of the fourth color filter and an area of the fifth color filter are the same.

18. The electronic device of claim 17, wherein the third color filter, the fourth color filter, and the fifth color filter overlaps the color control region.

19. The electronic device of claim 17, wherein the third color filter, the fourth color filter, and the fifth color filter overlaps the color control region, and
wherein the third color filter, the fourth color filter, and the fifth color filter are each provided in plural, wherein the third color filters of the plurality of third color filters are spaced apart from each other, the fourth color filters of the plurality of fourth color filters are spaced apart from each other, and the fifth color filters of the plurality of fifth color filters are spaced apart from each other.

20. An electronic device, comprising:
a display panel including a first region, a second region adjacent to the first region, and a third region surrounding at least a portion of the second region;
an optical layer disposed on the display panel;
a window disposed above the optical layer;
an electronic module disposed below the first region of the display panel; and
a housing disposed below the display panel and the electronic module,
wherein the display panel includes:
a first pixel including a first light emission element disposed in the first region and a first pixel circuit connected to the first light emission element and disposed in the second region;
a second pixel including a second light emission element disposed in the second region and a second pixel circuit electrically connected to the second light emission element and disposed in the second region; and
a third pixel including a third light emission element disposed in the third region and a third pixel circuit electrically connected to the third light emission element and disposed in the third region, and
the optical layer includes:
a first color filter overlapping the first light emission element;
a second color filter overlapping the second light emission element; and
a third color filter overlapping the third light emission element,
wherein the first color filter, the second color filter, and the third color filter transmit light of the same color, and a shape of the first color filter is different from a shape of the second color filter and a shape of the third color filter.

\* \* \* \* \*